(12) United States Patent  (10) Patent No.: US 9,146,473 B2
Mikami et al.  (45) Date of Patent: Sep. 29, 2015

(54) EXPOSURE DEVICE AND IMAGE FORMING APPARATUS

(71) Applicant: FUJI XEROX CO., LTD., Tokyo (JP)

(72) Inventors: Keiichi Mikami, Kanagawa (JP); Naoyuki Tada, Kanagawa (JP); Seiichi Takayama, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/103,053

(22) Filed: Dec. 11, 2013

(65) Prior Publication Data

US 2014/0320834 A1 Oct. 30, 2014

(30) Foreign Application Priority Data

Apr. 25, 2013 (JP) ................................. 2013-093115

(51) Int. Cl.
*B41J 2/45* (2006.01)
*G03F 7/20* (2006.01)
(52) U.S. Cl.
CPC .......... *G03F 7/70058* (2013.01); *G03F 7/2012* (2013.01)
(58) Field of Classification Search
USPC .................. 347/238, 242, 244, 245, 257, 263
See application file for complete search history.

(56) References Cited

U.S. PATENT DOCUMENTS 8,289,359 B2 * 10/2012 Yokoi et al. ................... 347/242

FOREIGN PATENT DOCUMENTS

| JP | A-2009-214340 | 9/2009 |
| JP | A-2011-079242 | 4/2011 |

* cited by examiner

*Primary Examiner* — Hai C Pham
(74) *Attorney, Agent, or Firm* — Oliff PLC

(57) ABSTRACT

An exposure device includes an exposure member, a positioning member, and a movement restricting member. The exposure member includes multiple light-emitting devices arranged along a first direction, which is an axial direction of an image carrier that rotates. The exposure member exposes the image carrier to light by emitting light in a second direction, which is a direction from the multiple light-emitting devices to the image carrier. The positioning member determines a position of the exposure member in the second direction relative to the image carrier by causing the exposure member to abut against the image carrier in the second direction. The movement restricting member is disposed on an end portion of the exposure member in the first direction and restricts movement of the exposure member relative to the positioning member.

3 Claims, 30 Drawing Sheets

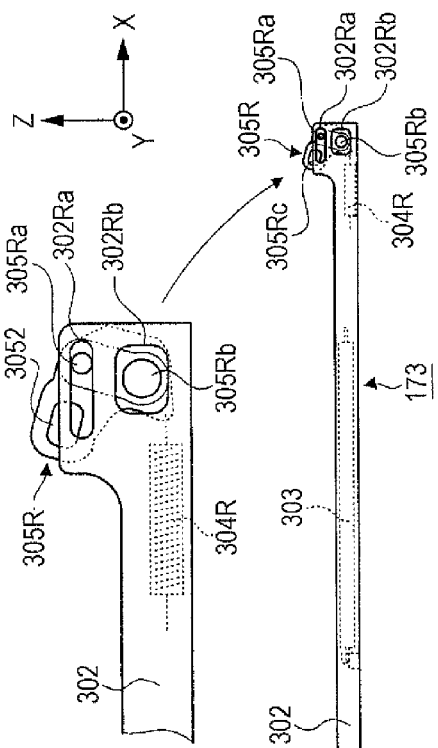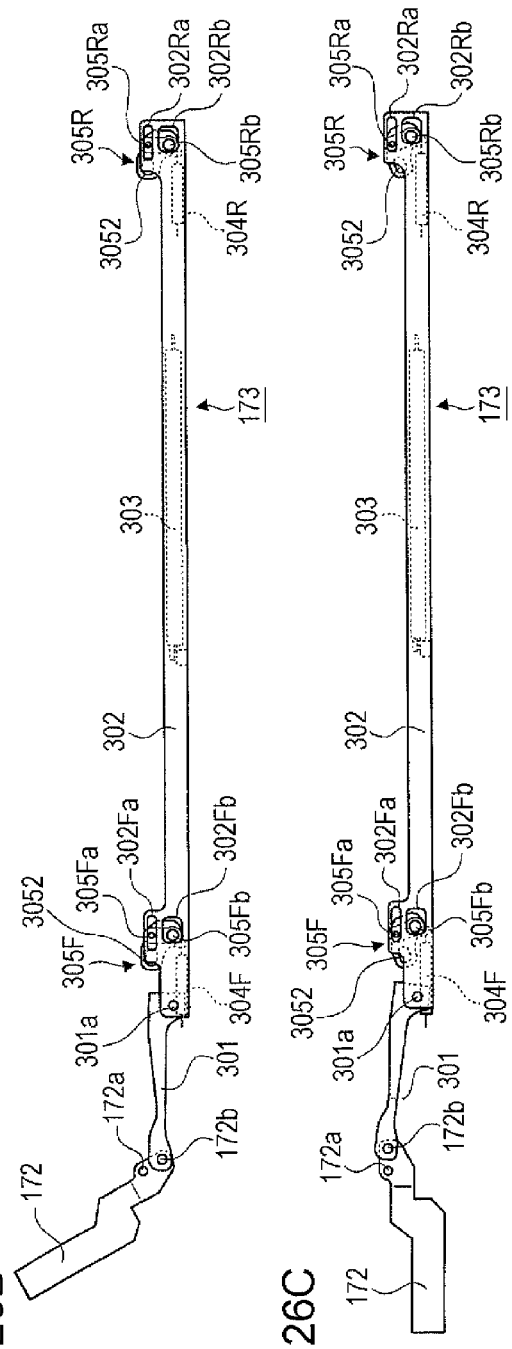
FIG. 26A
FIG. 26B
FIG. 26C

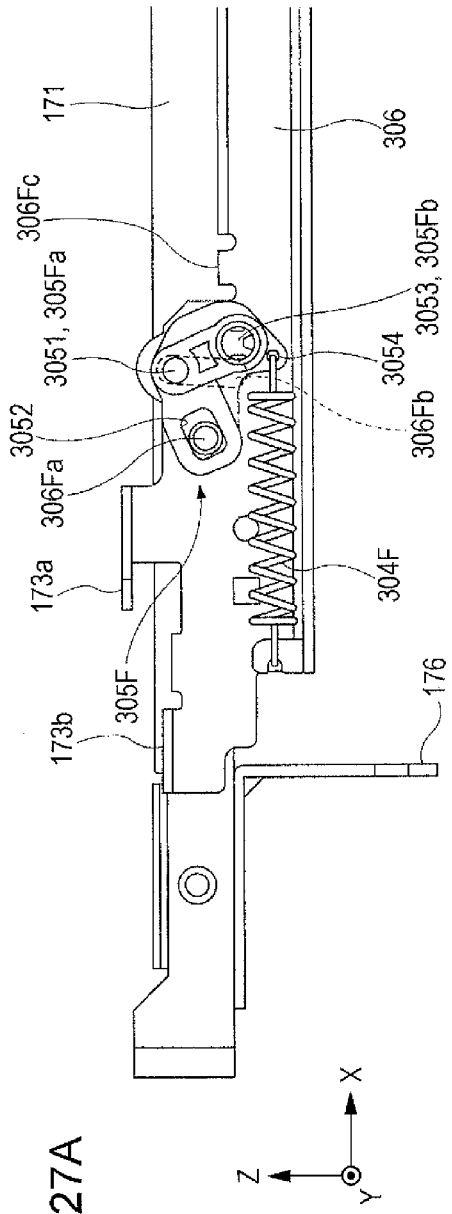
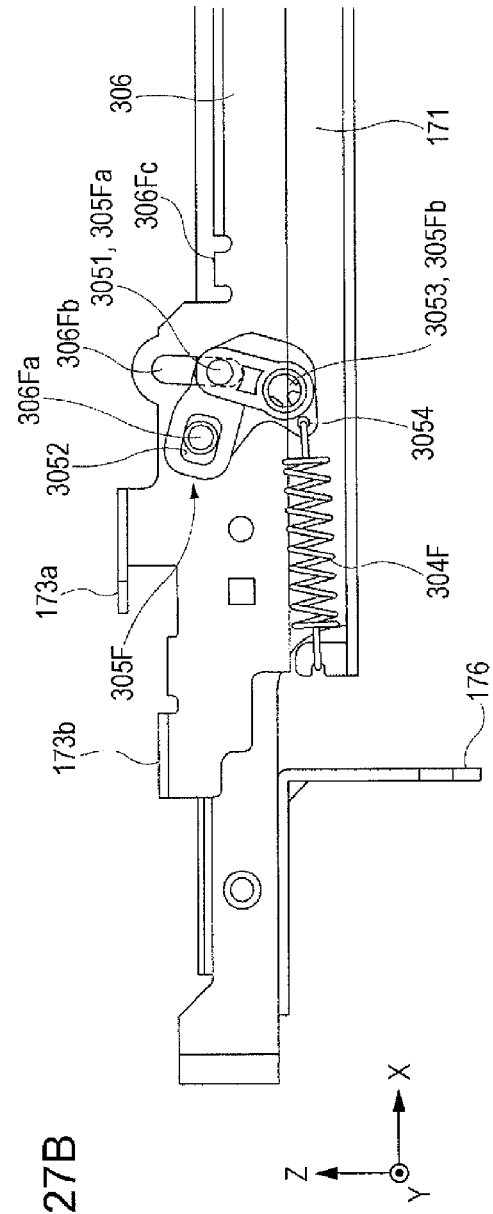

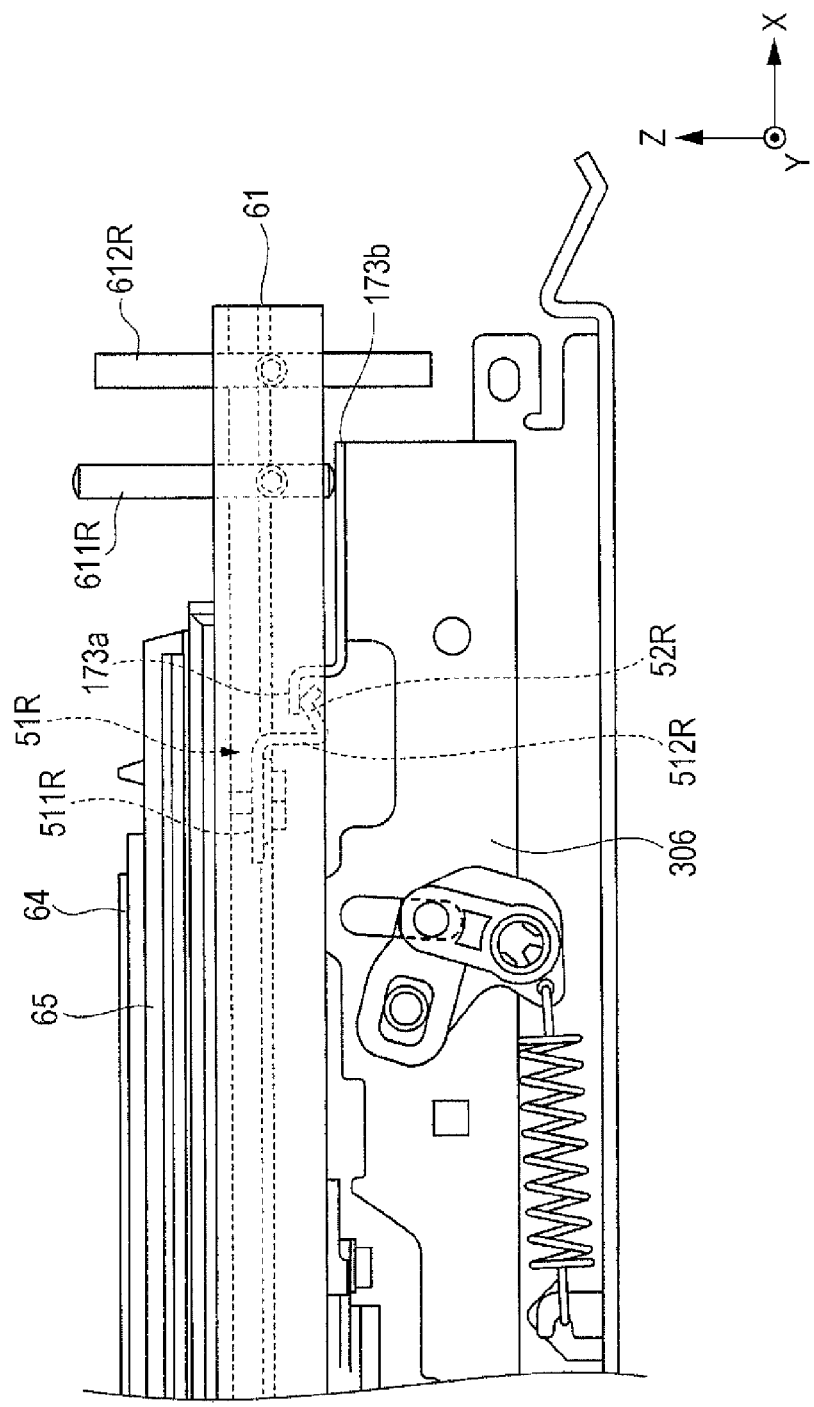

EXPOSURE DEVICE AND IMAGE FORMING APPARATUS

CROSS-REFERENCE TO RELATED APPLICATIONS

This application is based on and claims priority under 35 USC 119 from Japanese Patent Application No. 2013-093115 filed Apr. 25, 2013.

BACKGROUND

Technical Field

The present invention relates to an exposure device and an image forming apparatus.

SUMMARY

According to an aspect of the invention, an exposure device includes an exposure member, a positioning member, and a movement restricting member. The exposure member includes multiple light-emitting devices arranged along a first direction, which is an axial direction of an image carrier that rotates. The exposure member exposes the image carrier to light by emitting light in a second direction, which is a direction from the multiple light-emitting devices to the image carrier. The positioning member determines a position of the exposure member in the second direction relative to the image carrier by causing the exposure member to abut against the image carrier in the second direction. The movement restricting member is disposed on an end portion of the exposure member in the first direction and restricts movement of the exposure member relative to the positioning member.

BRIEF DESCRIPTION OF THE DRAWINGS

Exemplary embodiments of the present invention will be described in detail based on the following figures, wherein:

FIGS. 26A, 26B, and 26C illustrate the states of the retractable mechanism in an exposure position, in a standby position, and in a withdrawn position, respectively;

FIGS. 27A and 27B illustrate the states of the front side of the retractable mechanism;

FIG. 31 is a front view of the exposure module according to another exemplary embodiment where a rear-side portion of the exposure module is viewed in the −Y direction.

DETAILED DESCRIPTION

Figure 1:
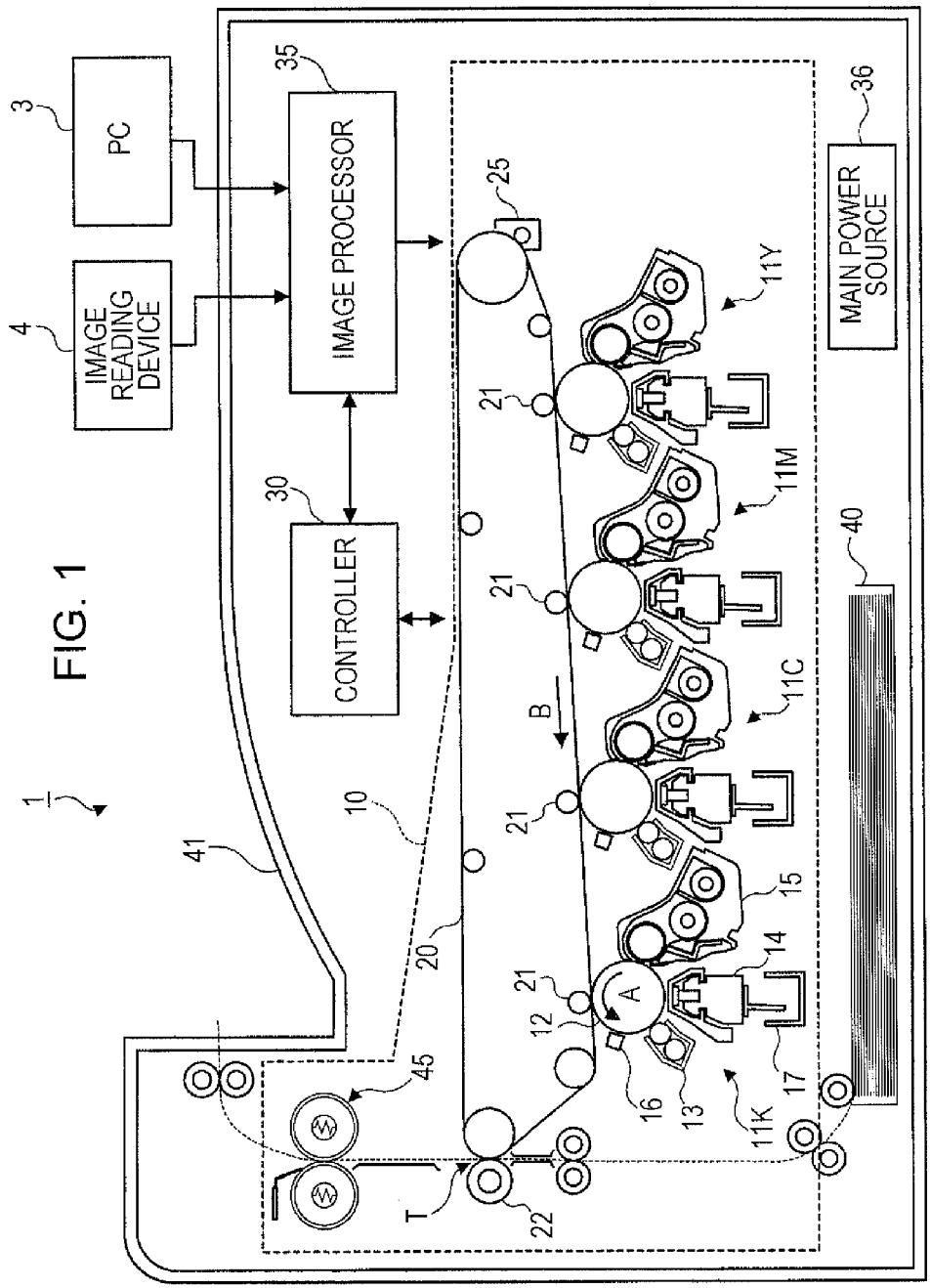
FIG. 1 illustrates a configuration example of an image forming apparatus according to an exemplary embodiment.

Referring to the drawings, exemplary embodiments of the present invention will be described in detail below.

FIG. 1 illustrates a configuration example of an image forming apparatus 1 according to an exemplary embodiment. The image forming apparatus 1 illustrated in FIG. 1 is a so-called tandem color printer. The image forming apparatus 1 includes an image forming processor 10, which forms images corresponding to image data for different colors, a controller 30, which controls operations of the image forming apparatus 1 as a whole, an image processor 35, and a main power source 36, which supplies power to each of the components. The image processor 35 is connected with an external device such as a personal computer (PC) 3 or an image reading device 4 and performs image processing on image data transmitted from the external device.

The image forming processor 10 includes four image forming units 11Y, 11M, 11C, and 11K, which are arranged side by side with certain intervals therebetween (hereinafter also simply referred to as "image forming units 11", collectively). Each image forming unit 11 includes a photoconductor drum 12, a charging device 13, which charges the surface of the photoconductor drum 12, an LED print head (LPH) 14, a developing device 15, and a cleaner 16. The photoconductor drum 12 is an example of an image carrier, which is rotatably disposed, on which an electrostatic latent image is formed, and which carries a toner image. The LPH 14 is an example of an exposure member that exposes the photoconductor drum 12 charged by the charging device 13 to light on the basis of image data to form an electrostatic latent image. The developing device 15 develops the electrostatic latent image formed on the photoconductor drum 12. The cleaner 16 cleans the surface of the photoconductor drum 12 subjected to a transfer operation. The photoconductor drum 12 according to the embodiment includes a rotation shaft, not illustrated, and is disposed such that the axial direction of the rotation shaft extends from the front side (near side in FIG. 1) to the rear side (far side in FIG. 1) of the image forming apparatus 1.

Each image forming unit 11 also has a retractable mechanism 17 that moves the LPH 14 between an exposure position, at which the LPH 14 exposes the photoconductor drum 12 to light, and a withdrawn position, at which the LPH 14 is separated further from the photoconductor drum 12 than in the case where the LPH 14 is in the exposure position. The image forming units 11 have the same configuration except for what color toners are contained in the corresponding developing devices 20. The image forming units 11 respectively form toner images of yellow (Y), magenta (M), cyan (C), and black (K).

The image forming processor 10 also includes an intermediate transfer belt 20, first transfer rollers 21, a second transfer roller 22, and a fixing device 45. The toner images of different colors formed on the photoconductor drums 12 of the image forming units 11 are transferred to the intermediate transfer belt 20 in a superposed manner. The first transfer rollers 21 sequentially transfer the toner images of different colors formed by the corresponding image forming units 11 to the intermediate transfer belt 20. The second transfer roller 22 collectively transfers the superposed toner image transferred to the intermediate transfer belt 20 to a sheet, serving as a recording medium. The fixing device 45 fixes the second-transferred image onto the sheet.

In each image forming unit 11, the photoconductor drum 12, the charging device 13, and the cleaner 16 are made as an integrated module (hereinafter referred to as a photoconductor module PM, which will be described below referring to FIG. 3). The photoconductor module PM is removably attached to the image forming apparatus 1 and replaced in accordance with the life of the photoconductor drum 12 or other conditions. Here, the photoconductor module PM may only include the photoconductor drum 12 without the charging device 13 and the cleaner 16 or may be an integrated module including the developing device 15 in addition to the charging device 13 and the cleaner 16. In other words, the photoconductor module PM may be formed by combining any components as long as it includes the photoconductor drum 12 that has shorter life than other components. In this embodiment, the photoconductor module PM and the LPH 14 are separate from each other.

In each image forming unit 11, the LPH 14 and the retractable mechanism 17 are also made as an integrated module (hereinafter referred to as an exposure module EM, which will be described below referring to FIG. 3). The exposure module EM, which is an example of an exposure device, is also removably attached to the image forming apparatus 1. The configurations of the photoconductor module PM and the exposure module EM will be described in detail below.

In the image forming apparatus 1, the image forming processor 10 performs an image forming operation in response to various types of control signals provided from the controller 30. Specifically, under control of the controller 30, image data input through the PC 3 or the image reading device 4 is subjected to image processing by the image processor 35 and then transmitted to each image forming unit 11 via an interface, not illustrated. Thereafter, for example, in the image forming unit 1K that forms a black (K) toner image, while rotating in the direction of arrow A in FIG. 1, the photoconductor drum 12 is charged by the charging device 13 at a predetermined potential and then exposed to light emitted by the LPH 14 on the basis of the image data transmitted from the image processor 35. Thus, an electrostatic latent image for a black (K) image is formed on the photoconductor drum 12. The electrostatic latent image formed on the photoconductor drum 12 is developed by the developing device 15, whereby a black (K) toner image is formed on the photoconductor drum 12. Each of the image forming units 11Y, 11M, and 11C similarly forms a toner image of the corresponding color of yellow (Y), magenta (M), or cyan (C).

The toner images of the corresponding colors formed by the respective image forming units 11 are sequentially and electrostatically drawn by the first transfer rollers 21 and transferred to the surface of the intermediate transfer belt 20 that moves in the direction of arrow B in FIG. 1, thereby forming a superposed toner image in which toner images of different colors are superposed on top of one another. As the intermediate transfer belt 20 moves, the superposed toner image on the intermediate transfer belt 20 is transported to a portion (second transfer portion T) in which the second transfer roller 22 is disposed. At the time when the superposed toner image is transported to the second transfer portion T, a sheet is fed to the second transfer portion T from a sheet container 40. The superposed toner image is electrostatically transferred as a whole to the sheet that has been transported to the second transfer portion T due to an effect of a transfer electric field formed by the second transfer roller 22 at the second transfer portion T.

The sheet to which the superposed toner image has been electrostatically transferred is then separated from the intermediate transfer belt 20 and transported to the fixing device 45. The superposed toner image on the sheet transported to the fixing device 45 is subjected to a fixing operation with heat and pressure by the fixing device 45 and thus fixed to the sheet. The sheet to which the image has been fixed is further transported to an ejected-sheet holder 41 provided in an ejection portion of the image forming apparatus 1.

On the other hand, after the second transfer is finished, the toner (remnant toner) adhering to the intermediate transfer belt 20 is removed by a belt cleaner 25 from the surface of the intermediate transfer belt 20 for the next image forming cycle. In this manner, the image forming apparatus 1 repeats the image formation cycle as many times as the number of sheets to be printed.

Figure 2:
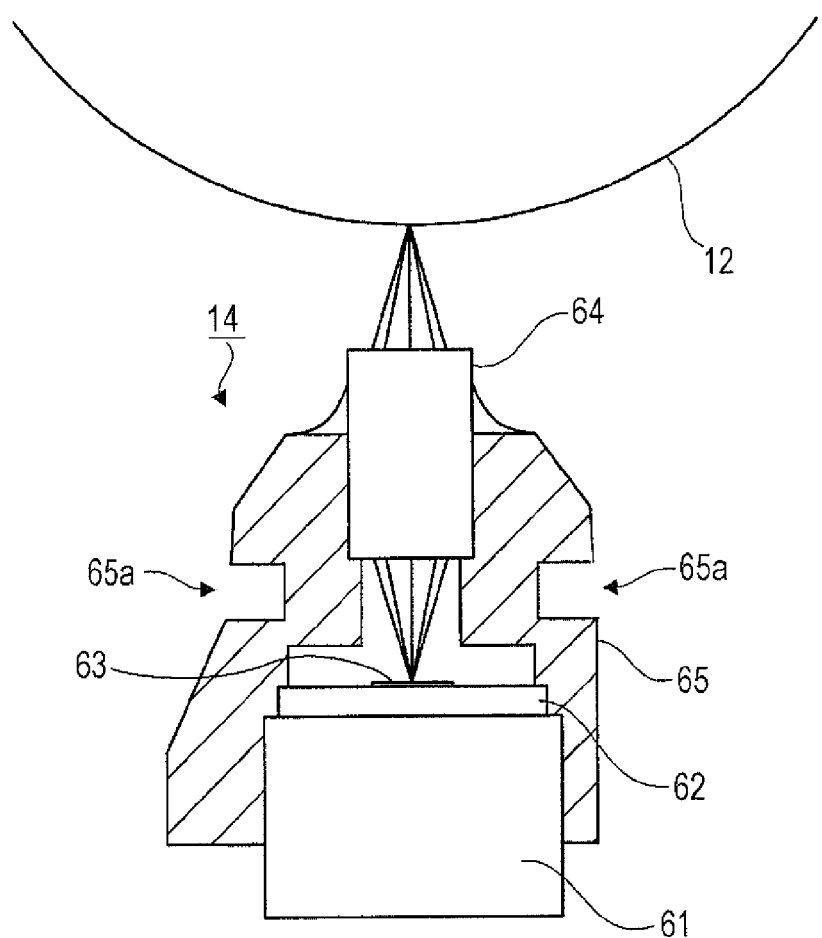
FIG. 2 is a cross sectional view of a configuration of an LED print head (LPH)

FIG. 2 is a cross sectional view of the configuration of the LPH 14. In the image forming apparatus 1 illustrated in FIG. 1, the LPH 14 is disposed below the photoconductor drum 12 and exposes the photoconductor drum 12 to light from below. As illustrated in FIG. 2, the LPH 14 includes a housing 61, an LED array 63, an LED circuit board 62, a rod lens array 64, and a holder 65. Components such as the LED array 63 and a signal generating circuit (not illustrated) that drives the LED array 63 are mounted on the LED circuit board 62. The rod lens array 64 causes light from the LED array 63 to be formed into an image on the surface of the photoconductor drum 12. The holder 65 supports the rod lens array 64 and shields the LED array 63 from the outside.

The housing 61 is made of a block or a sheet of metal such as aluminum or stainless steel and supports the LED circuit board 62. The rod lens array 64 is arranged along the axial direction of the photoconductor drum 12 and has a width in the rotation direction of the photoconductor drum 12. The rod lens array 64 includes multiple graded index lenses, which form erect one-to-one magnification images, arranged side by side. The holder 65 has a long shape and is disposed so as to extend in the axial direction of the photoconductor drum 12. The holder 65 also supports the housing 61 and the rod lens array 64 such that the point from which the LED array 63 emits light and the focal plane of the rod lens array 64 coincide with each other. The holder 65 tightly covers the LED array 63 and dust is thus less likely to adhere to the LED array 63 from the outside. The holder 65 also includes guide grooves 65a on both side surfaces in the width direction. The guide grooves 65a extend in the longitudinal direction (axial direction of the photoconductor drum 12) and along which a sliding member 67 (see FIG. 8), which will be described below, is guided when sliding.

On the LED circuit board 62, the LED array 63 including multiple LED chips is linearly arranged in a precise manner so as to be parallel to the axial direction of the photoconductor drum 12. Here, the LED chips are alternately arranged in a staggered manner such that the light-emitting devices (LED) included in the LED chips are continuously connected to one another at their boundaries. Consequently, multiple light-emitting devices (LED) are arranged on the LED circuit board 62.

Subsequently, a positioning mechanism of the LPH 14 in the image forming apparatus 1 will be described.

Figure 3:
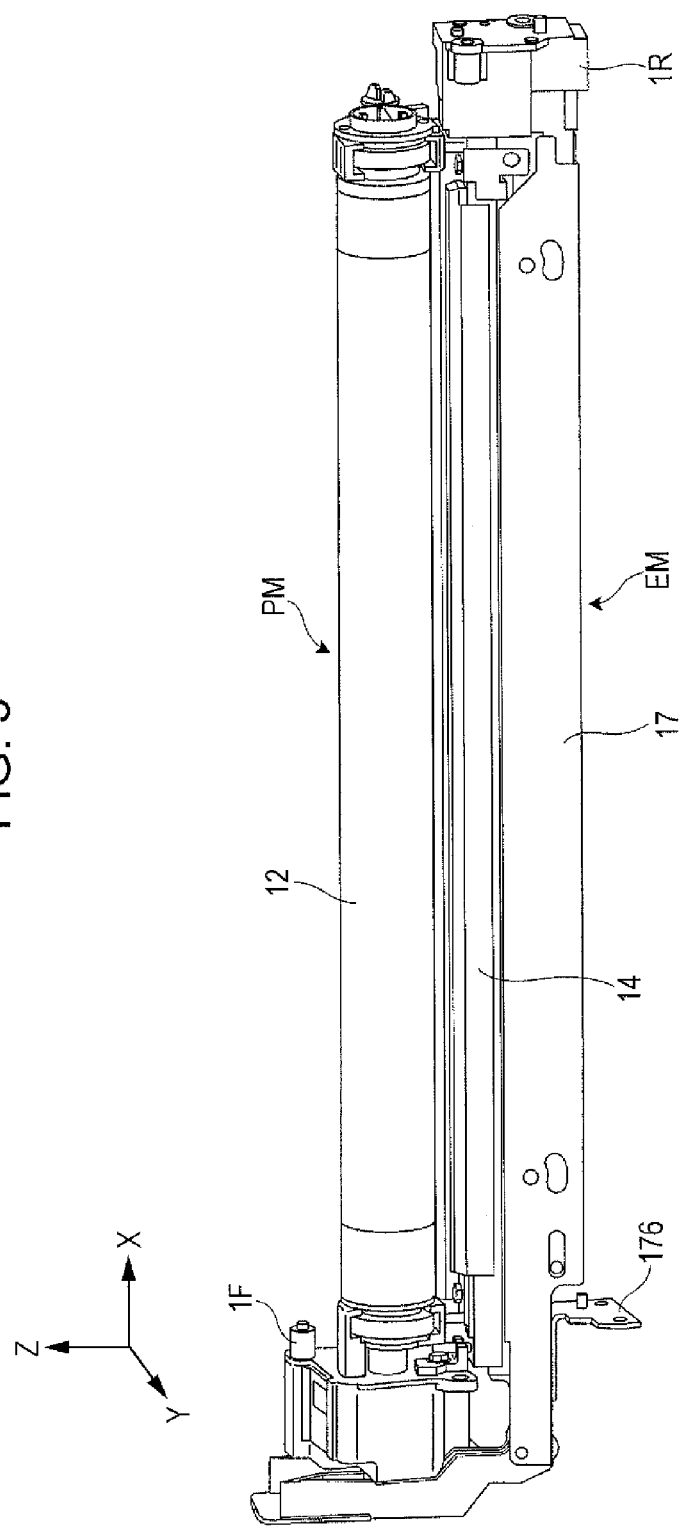
FIG. 3 is a perspective view of the state of an image forming apparatus to which a photoconductor module, including a photoconductor drum, and an exposure module, including the LPH and a retractable mechanism, are attached.
Figure 4:
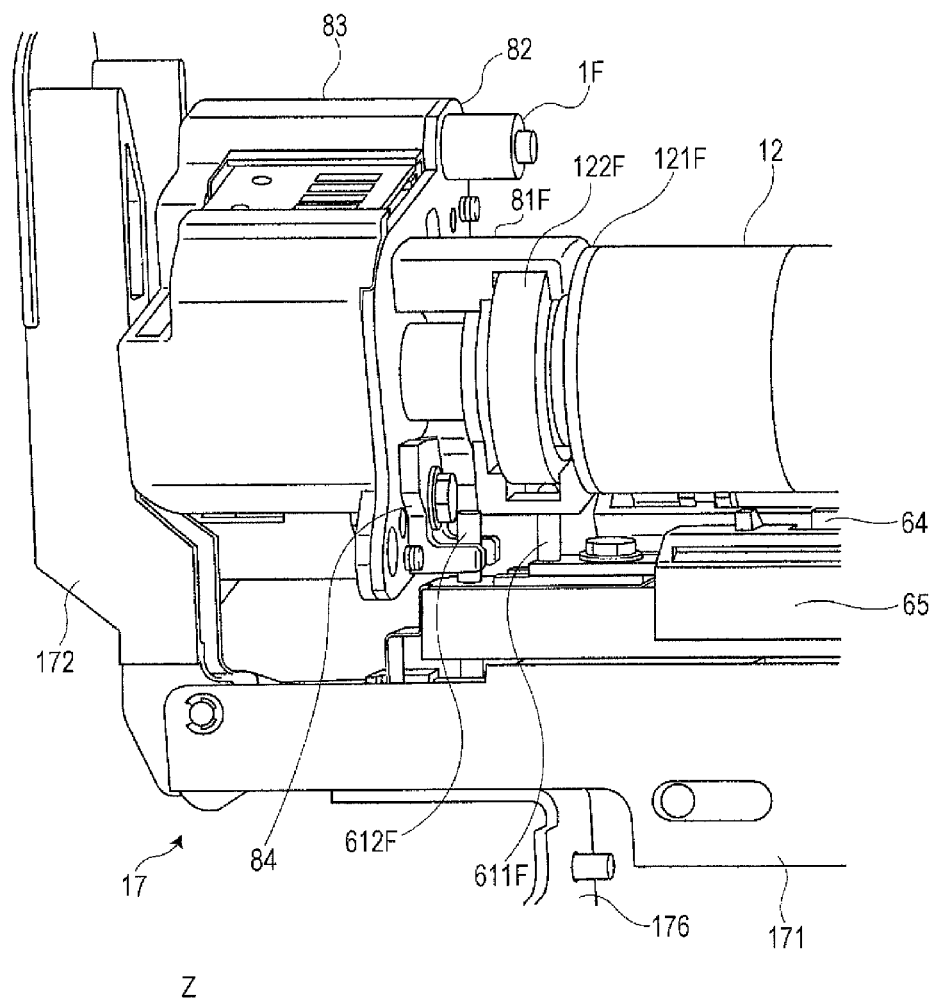
FIG. 4 illustrates the front-side portion of the state illustrated in FIG. 3 in an enlarged manner.
Figure 5:
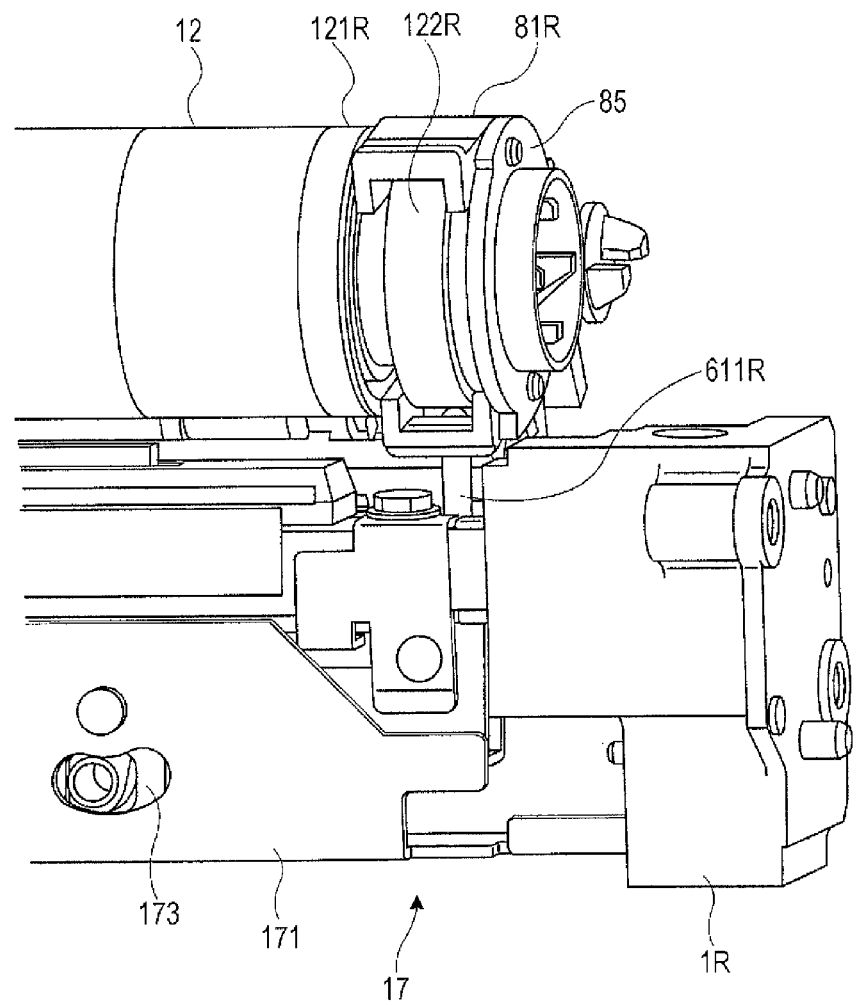
FIG. 5 illustrates the rear-side portion of the state illustrated in FIG. 3 in an enlarged manner.

FIG. 3 is a perspective view of the state of the image forming apparatus 1 to which the photoconductor module PM, including the photoconductor drum 12, and the exposure module EM, including the LPH 14 and the retractable mechanism 17, are attached. In FIG. 3, the left side is the front side of the image forming apparatus 1 from which the photoconductor module PM is attached to or removed from the image forming apparatus 1 and the right side is the rear side of the image forming apparatus 1 from which the power from a driving motor (not illustrated) attached to the image forming apparatus 1 is fed to the photoconductor drum 12 and other components. FIG. 3 illustrates the state where the LPH 14 included in the exposure module EM is set in the above-described exposure position. FIG. 4 illustrates the front side portion illustrated in FIG. 3 in an enlarged manner and FIG. 5 illustrates the rear side portion illustrated in FIG. 3 in an enlarged manner.

Figure 6:
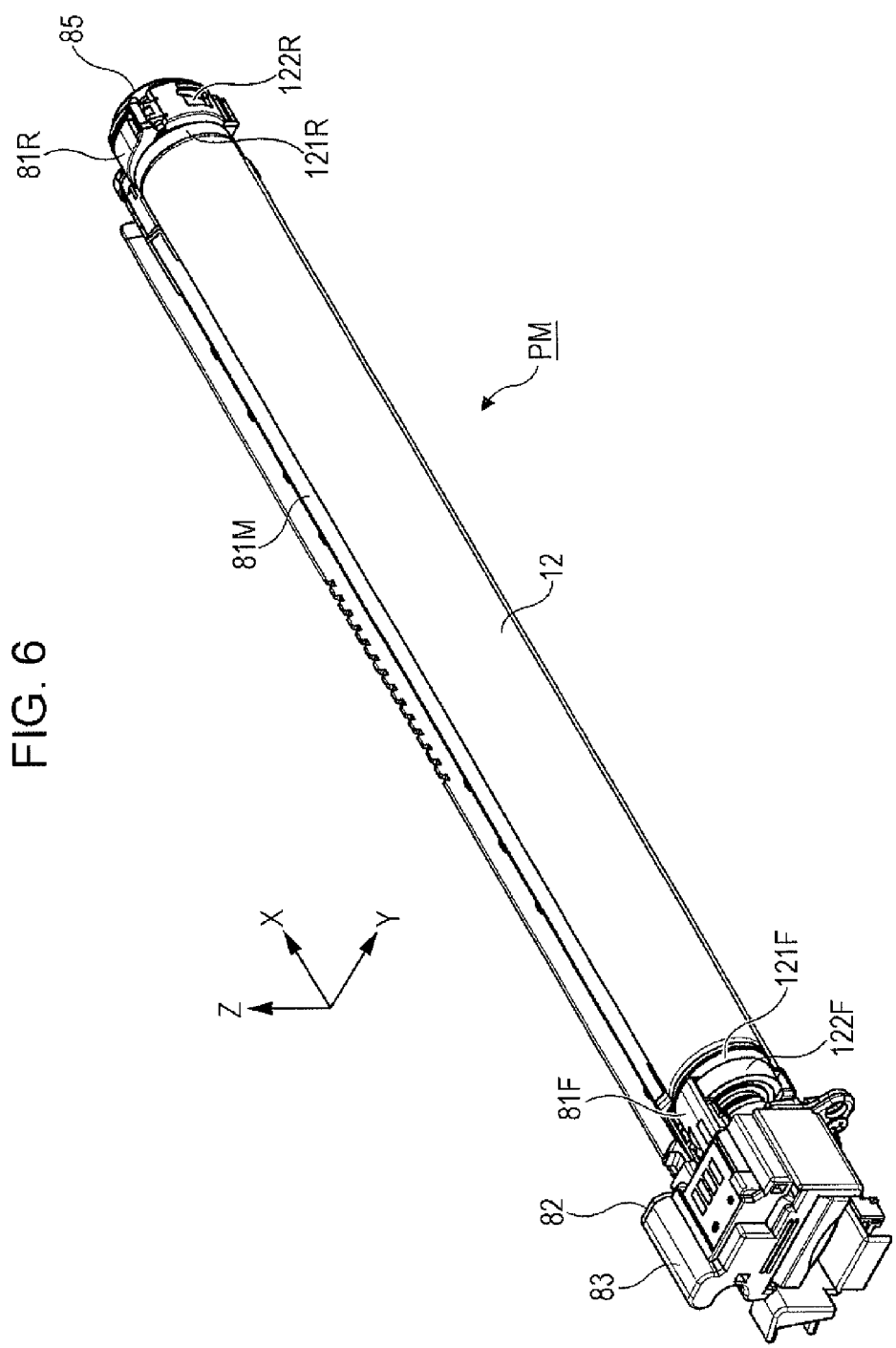
FIG. 6 is a perspective view of a configuration of the photoconductor module.

FIG. 6 is a perspective view of a configuration of the photoconductor module PM. In FIG. 6, the lower left side corresponds to the front side of the image forming apparatus 1 and the upper right side corresponds to the rear side of the image forming apparatus 1.

Figure 7:
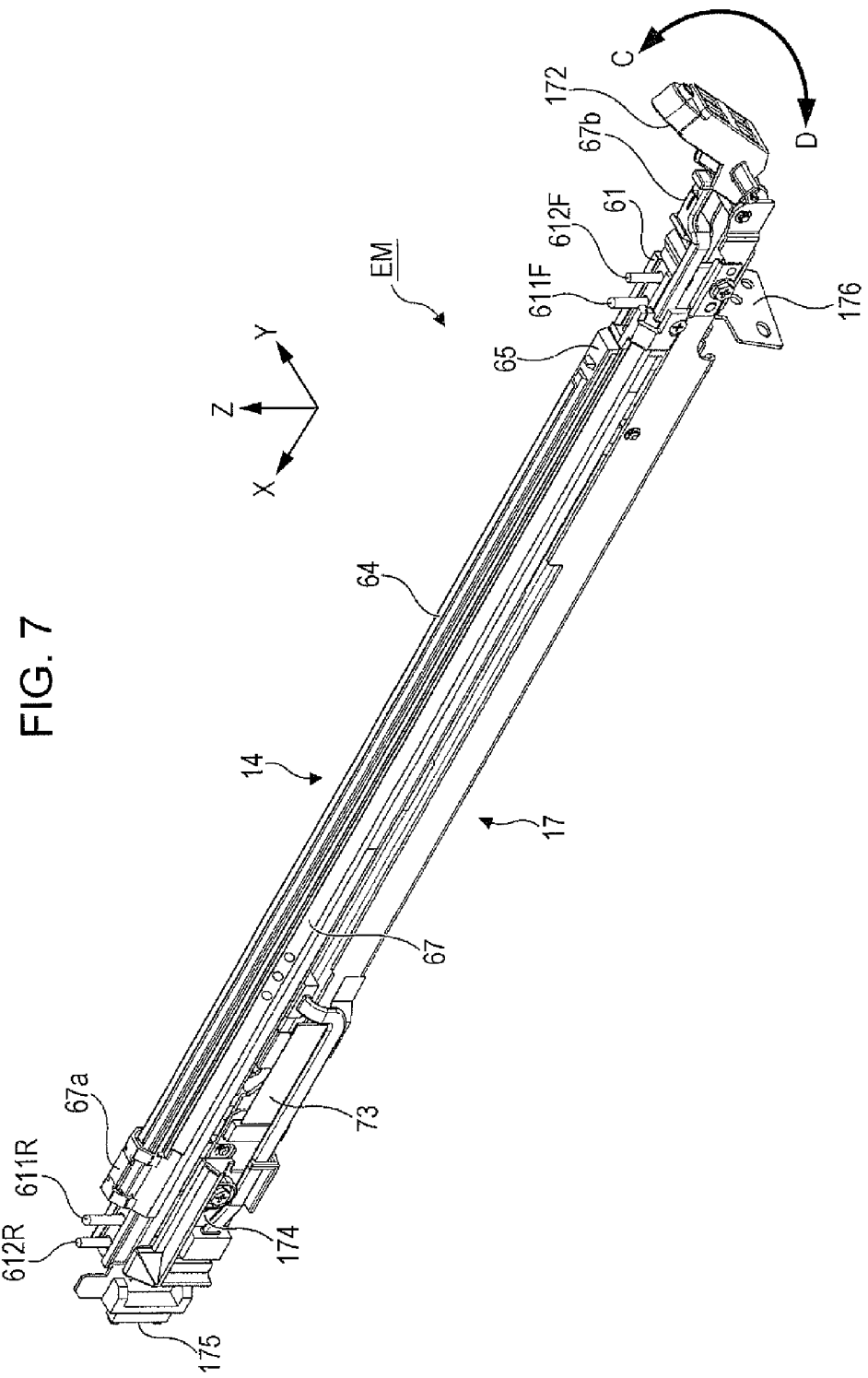
FIG. 7 is a perspective view of a configuration of the exposure module.

FIG. 7 is a perspective view of a configuration of the exposure module EM. In FIG. 7, the lower right side corresponds to the front side of the image forming apparatus 1 and the upper left side corresponds to the rear side of the image forming apparatus 1.

Figure 8:
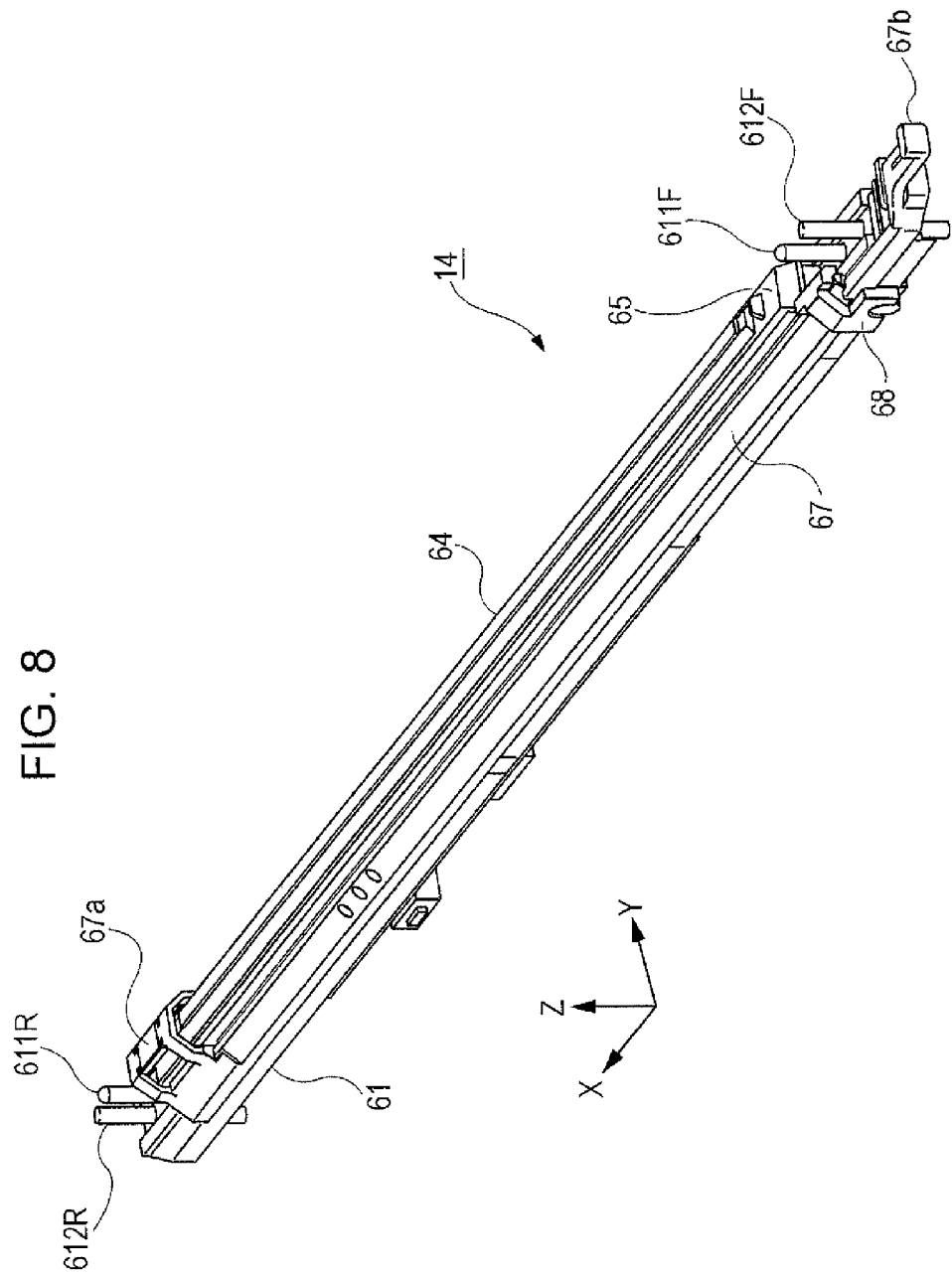
FIG. 8 is a perspective view of a configuration of the LPH of the exposure module.

FIG. 8 is a perspective view of a configuration of the LPH 14 of the exposure module EM. In FIG. 8, the lower right side corresponds to the front side of the image forming apparatus 1 and the upper left side corresponds to the rear side of the image forming apparatus 1.

Figure 9:
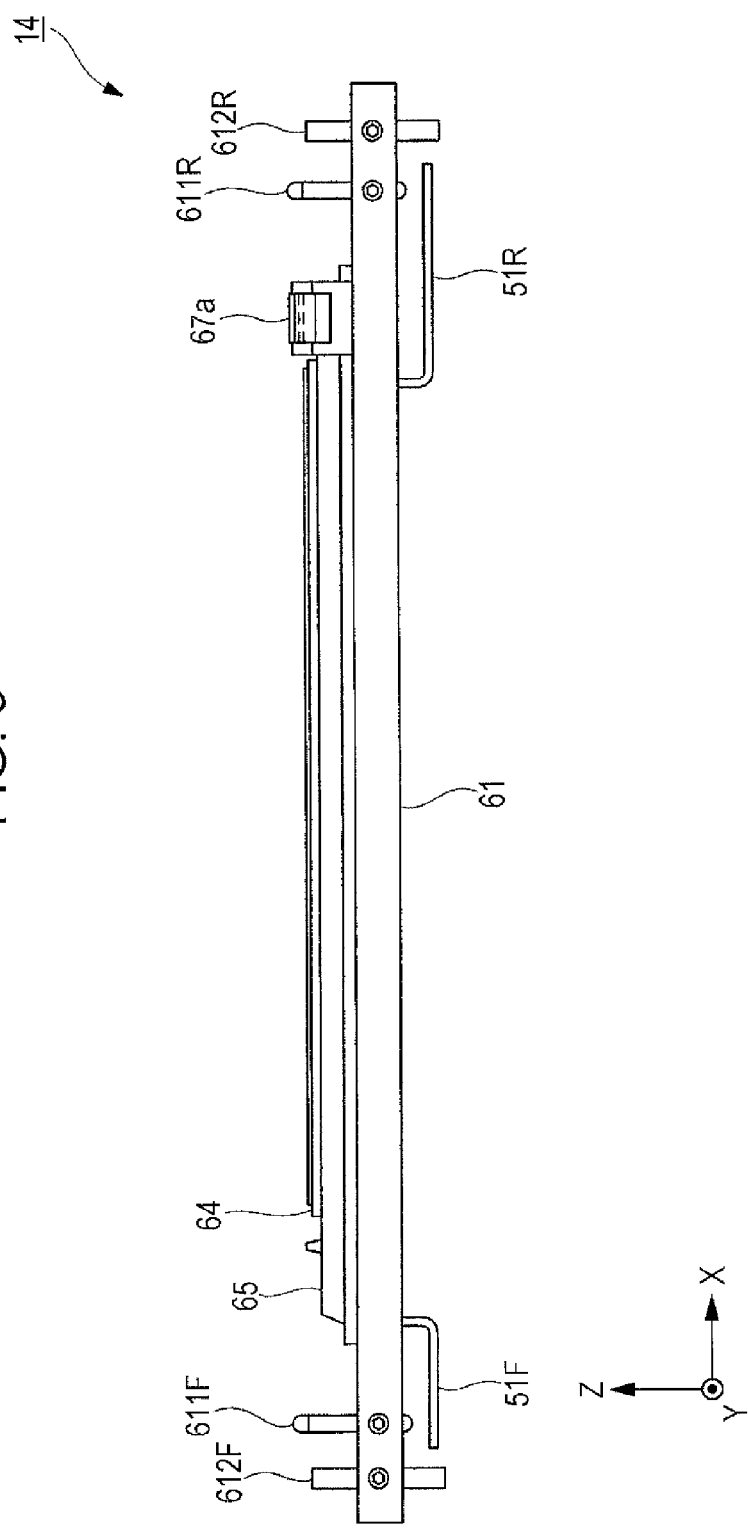
FIG. 9 is a side view of the LPH illustrated in FIG. 8 where the LPH is viewed in the Y direction.
Figure 10A:
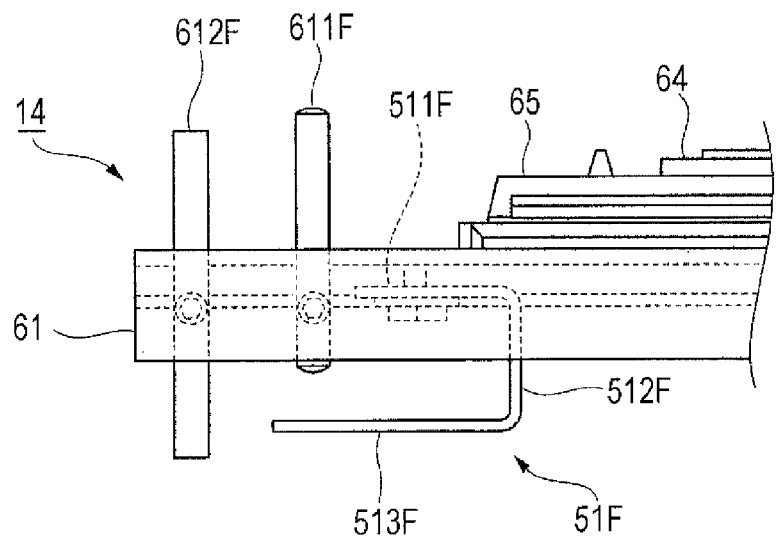
FIG. 10A is an enlarged view of the portion XA illustrated in FIG. 9
Figure 10B:
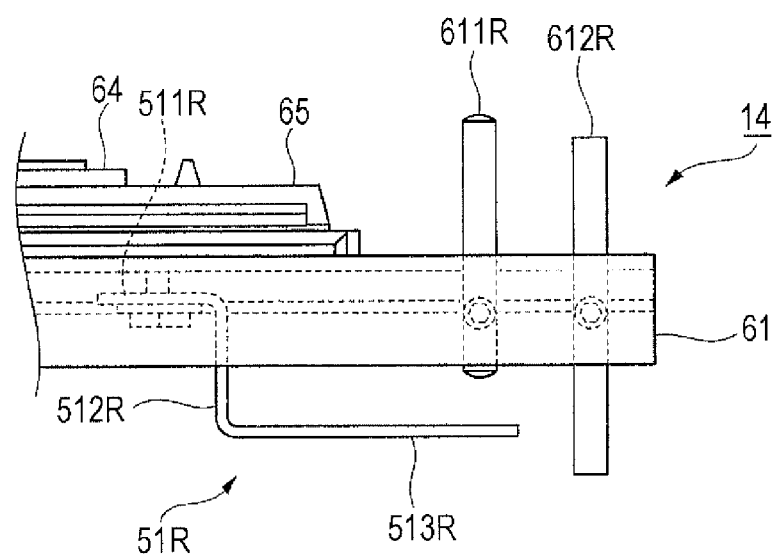
FIG. 10B is an enlarged view of the portion XB illustrated in FIG. 9.

FIG. 9 is a side view of the LPH 14 illustrated in FIG. 8 where the LPH 14 is viewed in the Y direction. FIGS. 10A and 10B illustrate the configuration of the LPH 14 in detail. FIG. 10A is an enlarged view of the portion XA illustrated in FIG. 9 and FIG. 10B is an enlarged view of the portion XB illustrated in FIG. 9. In FIGS. 9, 10A, and 10B, the left side corresponds to the front side of the image forming apparatus 1 and the right side corresponds to the rear side of the image forming apparatus 1.

Figure 11:
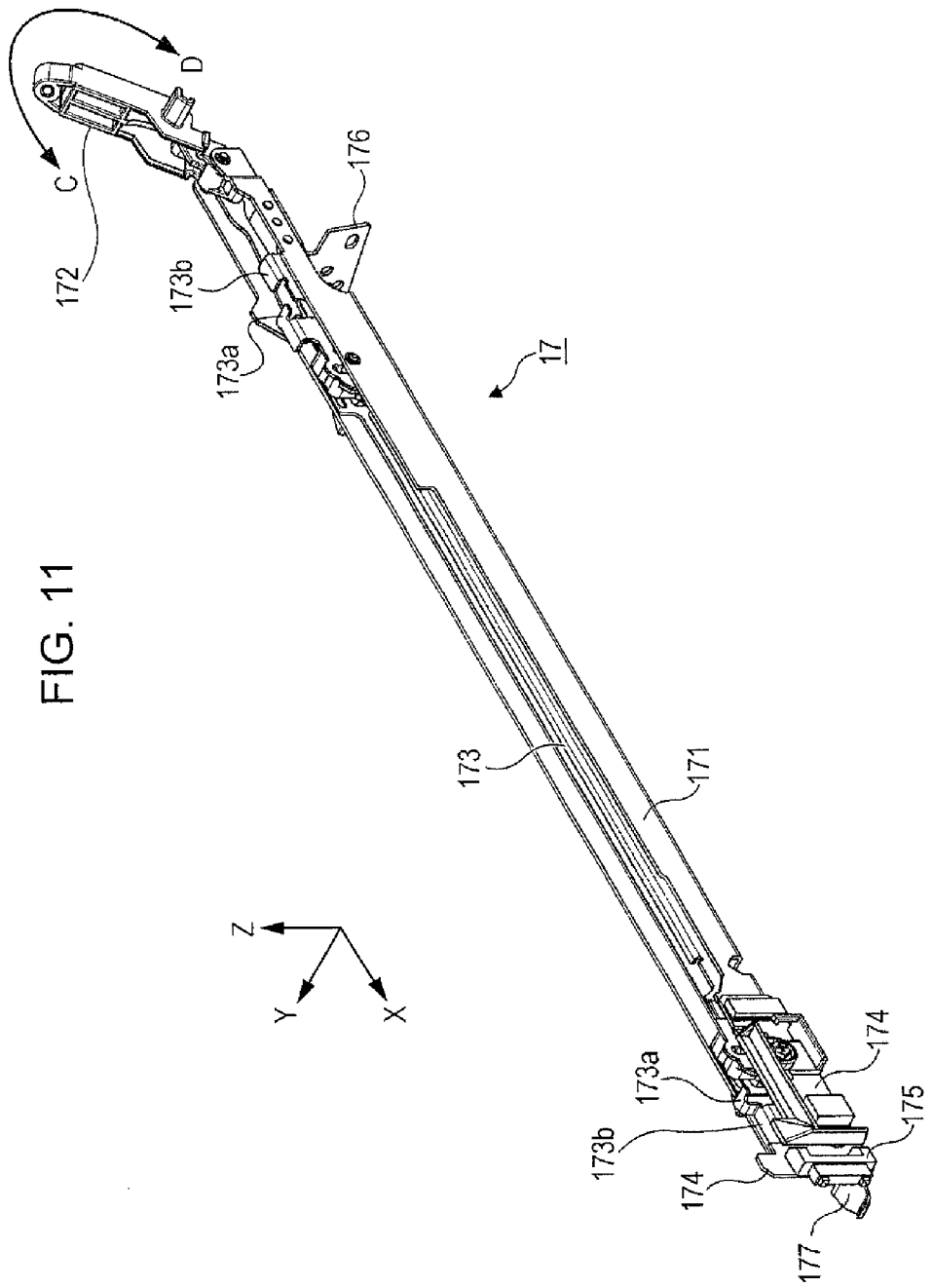
FIG. 11 is a perspective view of a configuration of the retractable mechanism of the exposure module.
Figure 12:
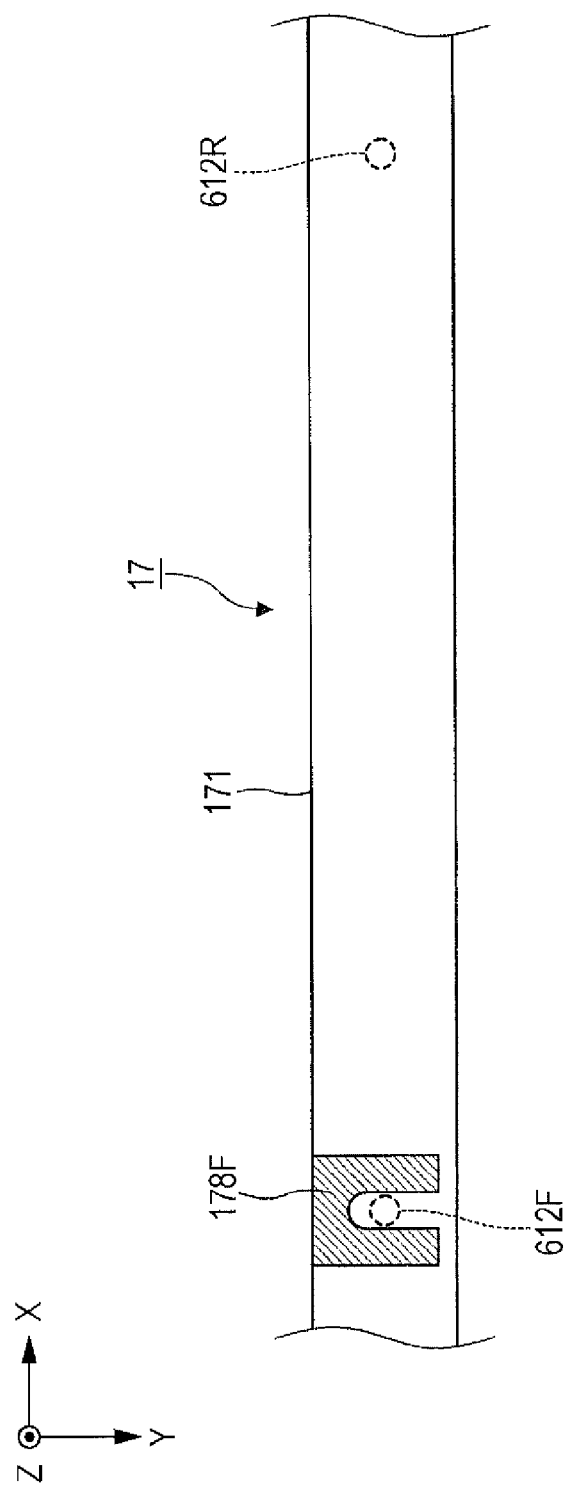
FIG. 12 illustrates a front restricting member of the retractable mechanism.

FIG. 11 is a perspective view of a configuration of the retractable mechanism 17 of the exposure module EM. FIG. 12 illustrates a front restricting member 178F (described below) of the retractable mechanism 17. In FIG. 11, the upper right side corresponds to the front side of the image forming apparatus 1 and the lower left side corresponds to the rear side of the image forming apparatus 1. In FIG. 12, the left side corresponds to the front side of the image forming apparatus 1 and the right side corresponds to the rear side of the image forming apparatus 1.

Figure 13:
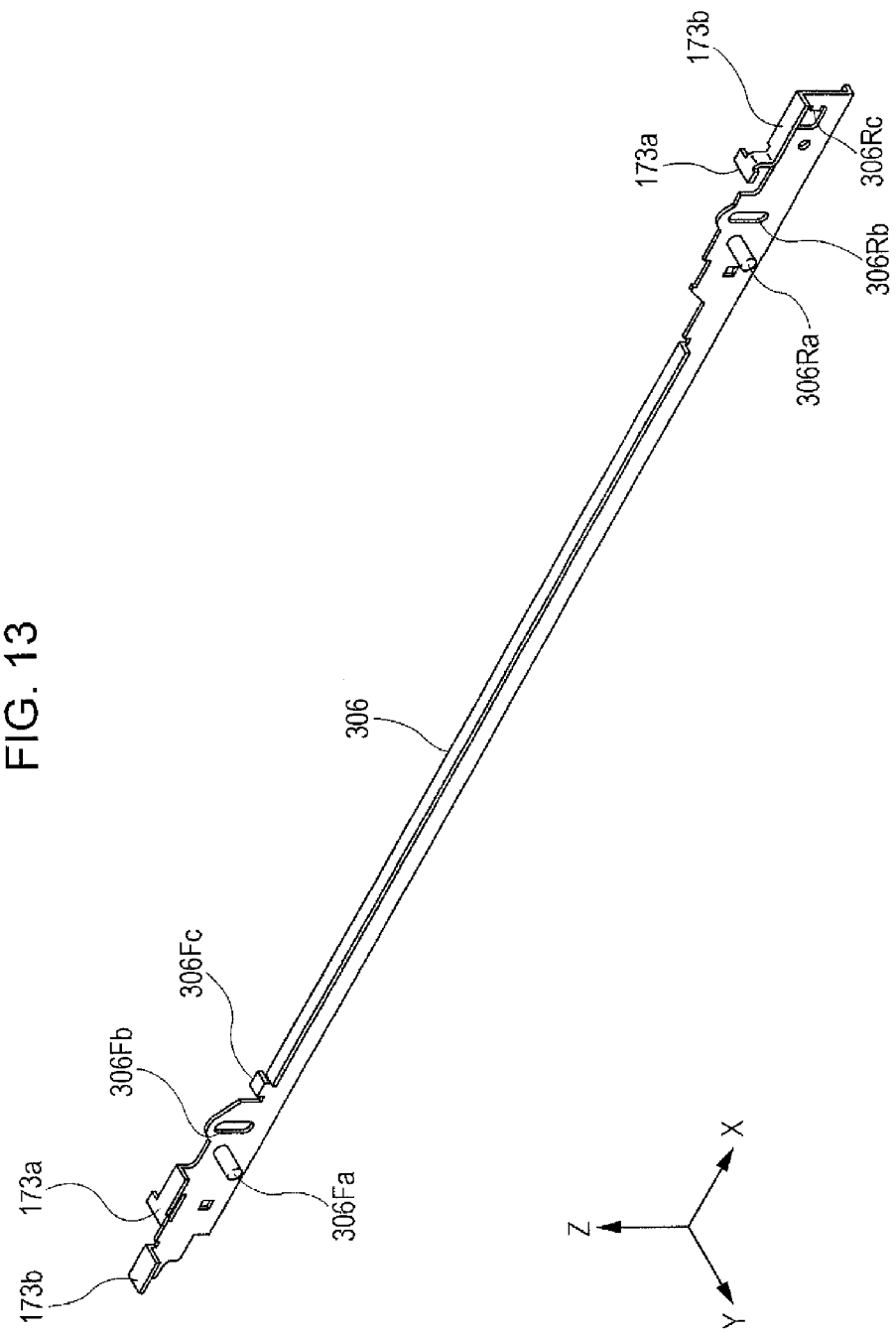
FIG. 13 is a perspective view of a configuration of a raising-and-lowering member of the retractable mechanism.
Figure 14:
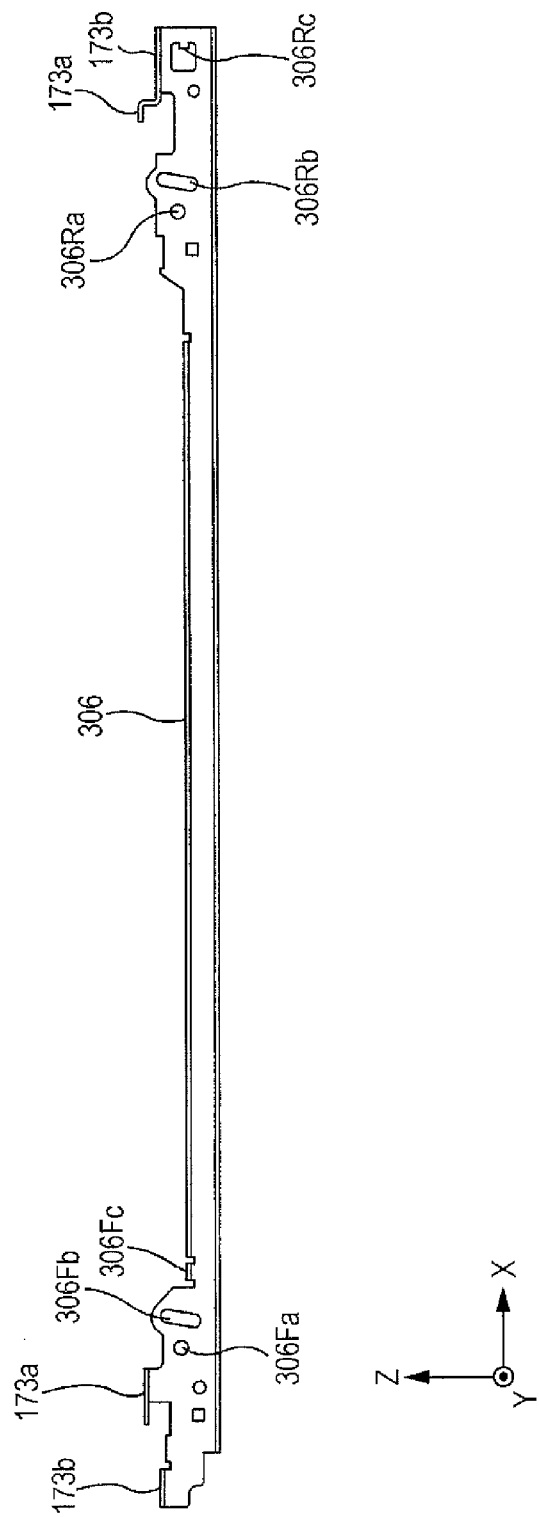
FIG. 14 is a front view of the raising-and-lowering member.
Figure 15:
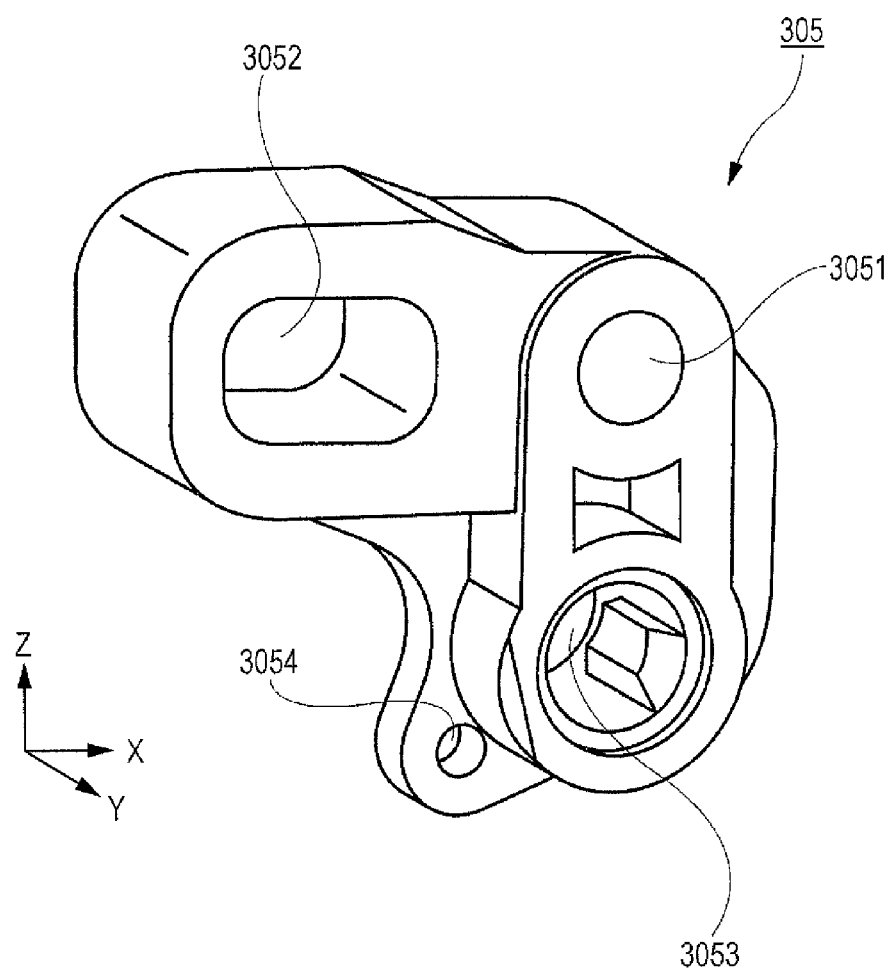
FIG. 15 is a perspective view of a configuration of a cam of the retractable mechanism.

FIG. 13 is a perspective view of a configuration of a raising-and-lowering member 306 (described below) of the retractable mechanism 17. FIG. 14 is a front view of the raising-and-lowering member 306. FIG. 15 is a perspective view of a configuration of a cam 305 (a front cam 305F and a rear cam 305R, which are described below) of the retractable mechanism 17.

In FIG. 13, the upper left side corresponds to the front side of the image forming apparatus 1 and the lower right side corresponds to the rear side of the image forming apparatus 1. In FIG. 14, the left side corresponds to the front side of the image forming apparatus 1 and the right side corresponds to the rear side of the image forming apparatus 1. In FIG. 15, the left side corresponds to the front side of the image forming apparatus 1 and the right side corresponds to the rear side of the image forming apparatus 1.

Figure 16A:
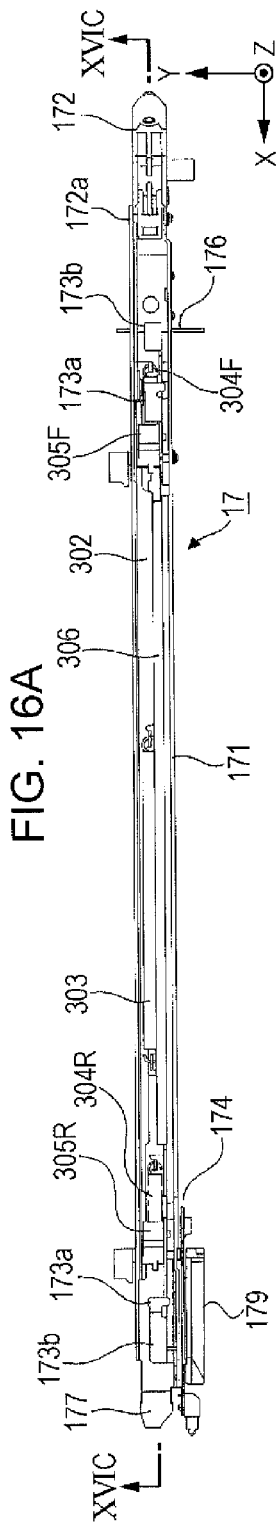
FIG. 16A is a top plan view of the retractable mechanism where the mechanism is viewed in the Z direction.
Figure 16B:
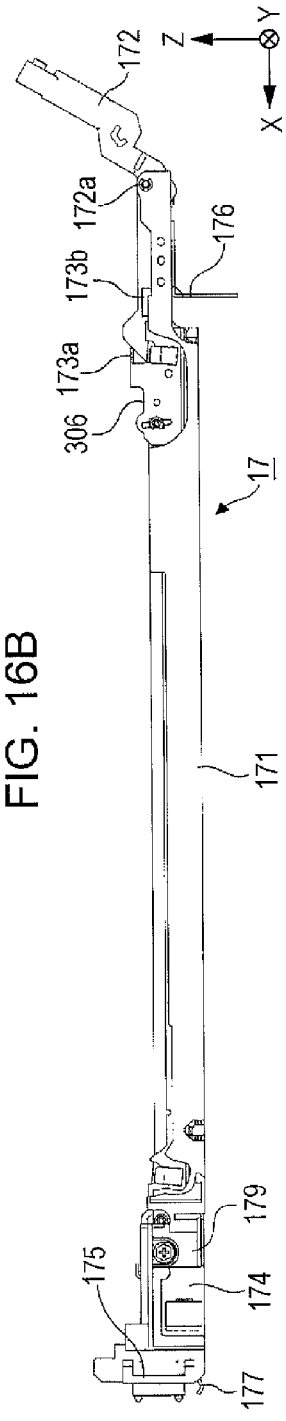
FIG. 16B is a side view of the retractable mechanism where the mechanism is viewed in the Y direction.
Figure 16C:
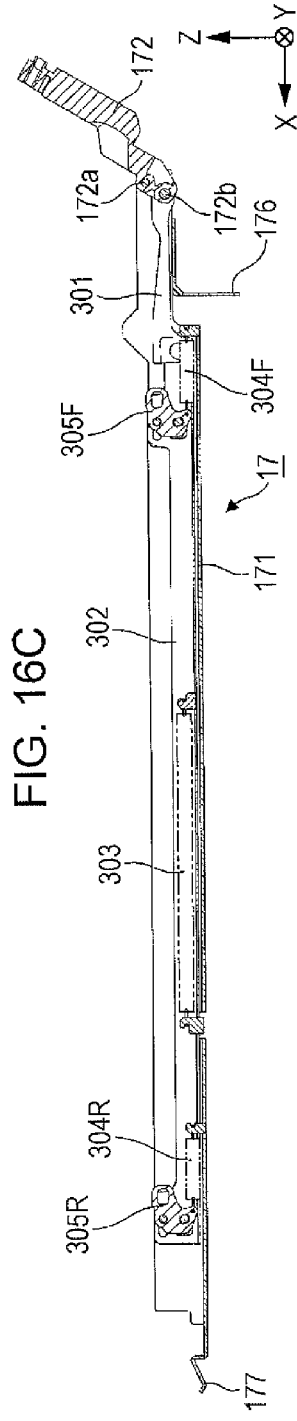
FIG. 16C is a cross sectional view of the retractable mechanism taken along the line XVIC-XVIC of FIG. 16A.
Figure 17:
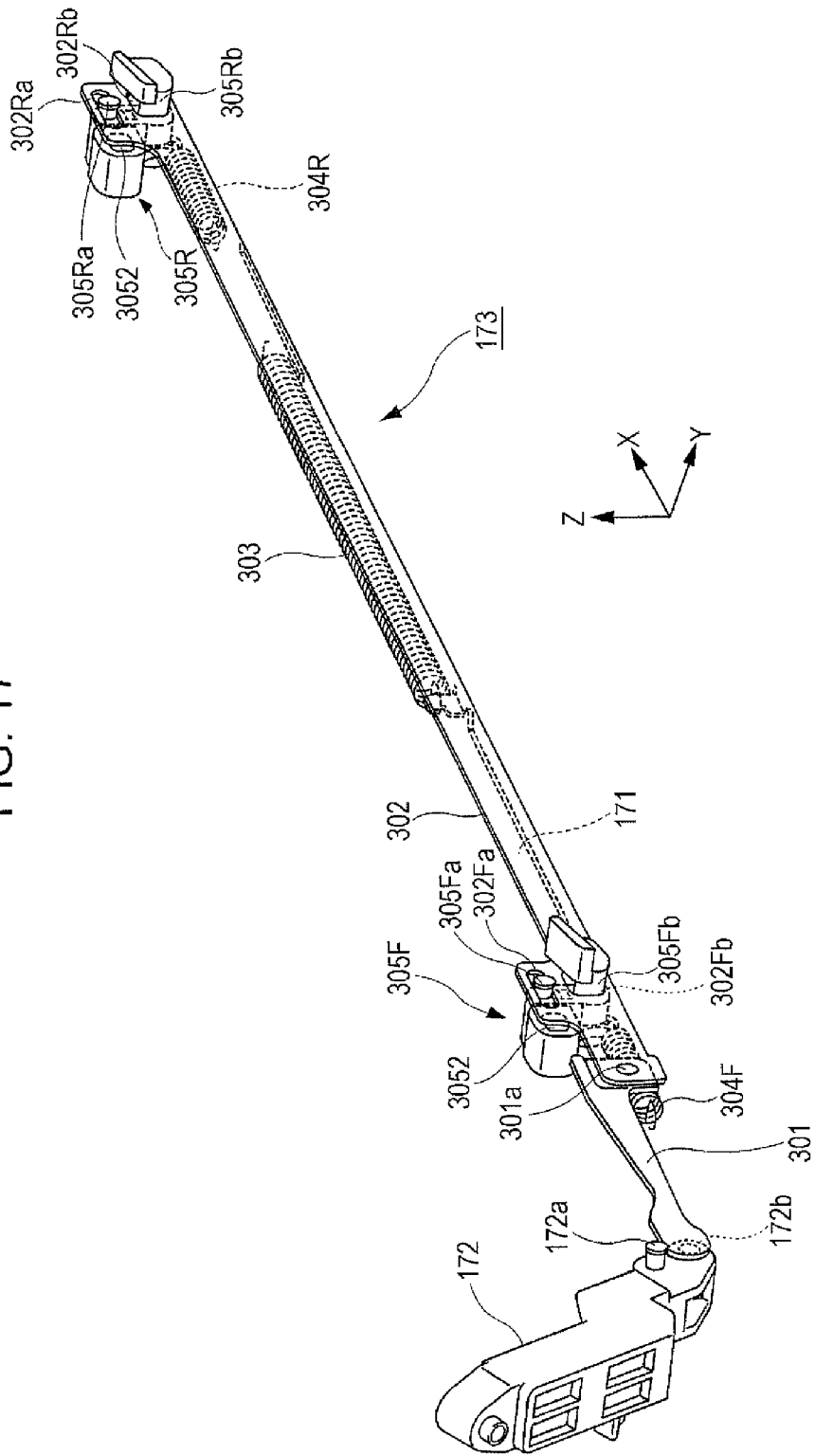
FIG. 17 is a perspective view of a related portion of a link mechanism of the retractable mechanism.
Figure 18:
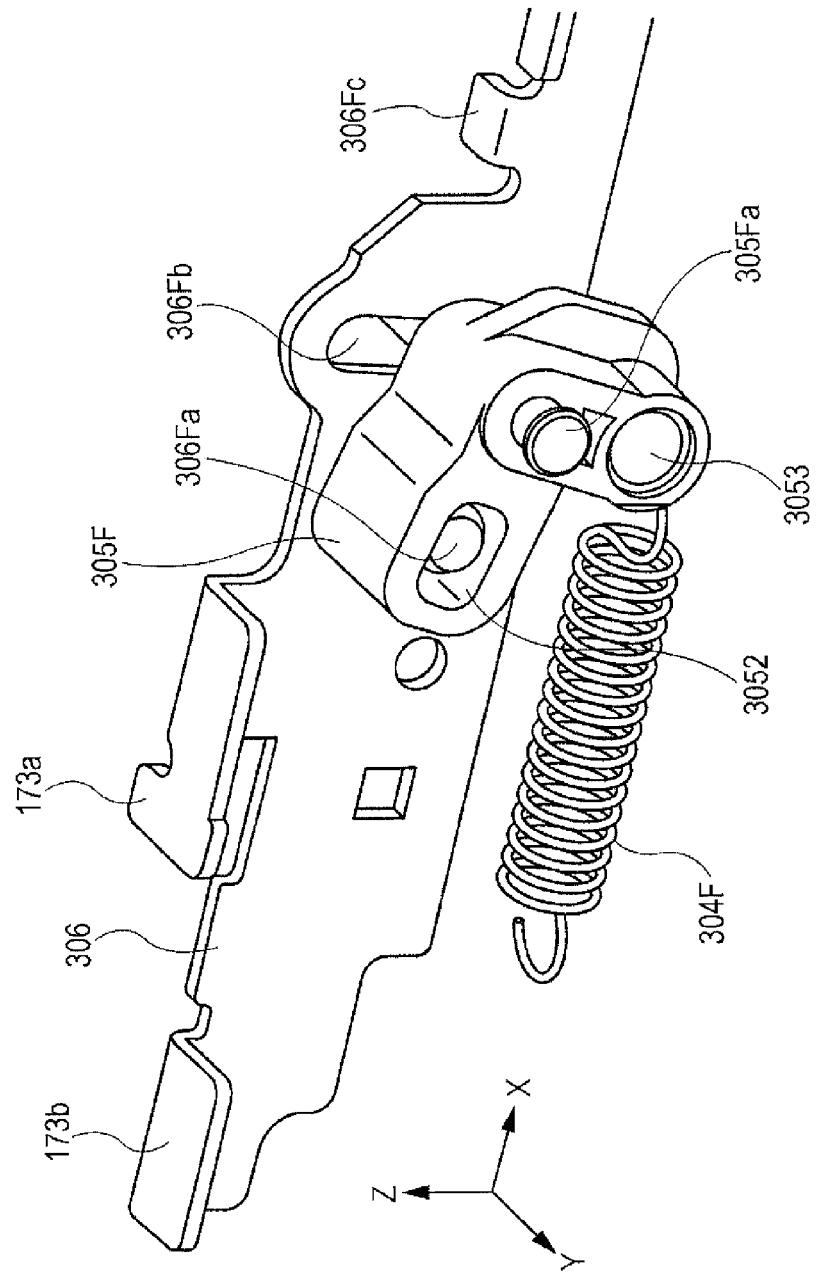
FIG. 18 is a perspective view illustrating the positional relationship between the raising-and-lowering member of the retractable mechanism, a front cam, and a front coil spring.

FIG. 16A is a top plan view of the retractable mechanism 17 where the mechanism is viewed in the Z direction, FIG. 16B is a side view of the retractable mechanism 17 where the mechanism 17 is viewed in the Y direction, and FIG. 16C is a cross sectional view of the retractable mechanism 17 taken along the line XVIC-XVIC of FIG. 16A. FIG. 17 is a perspective view of a related portion of a link mechanism 173 (described below) of the retractable mechanism 17. FIG. 18 is a perspective view illustrating the positional relationship between the raising-and-lowering member 306 of the retractable mechanism 17, a front cam 305F, and a front coil spring 304F, which will be described below. Here, FIG. 18 illustrates the positional relationship when the retractable mechanism 17 sets the LPH 14 to the exposure position.

In FIG. 16, the right side corresponds to the front side of the image forming apparatus 1 and the left side corresponds to the rear side of the image forming apparatus 1. In FIG. 17, the lower left side corresponds to the front side of the image forming apparatus 1 and the upper right side corresponds to the rear side of the image forming apparatus 1. In FIG. 18, the upper left side corresponds to the front side of the image forming apparatus 1 and the lower right side corresponds to the rear side of the image forming apparatus 1.

Figure 19:
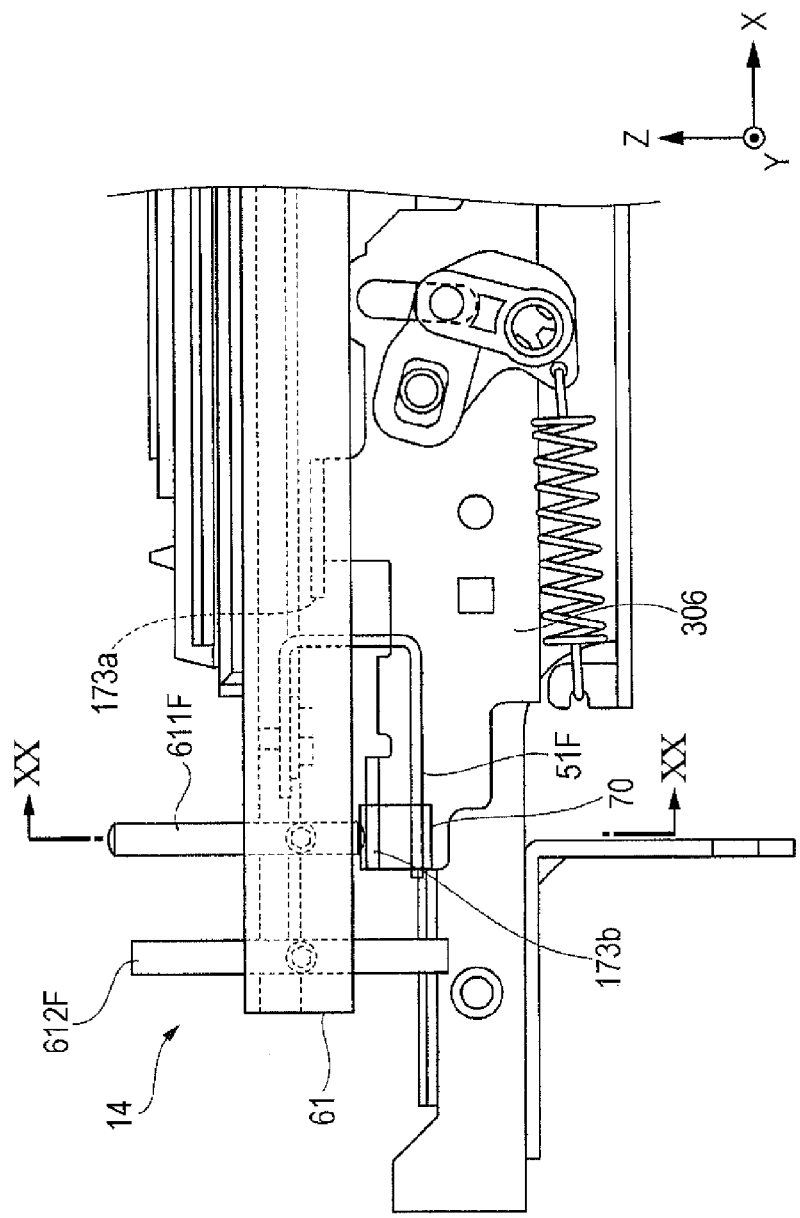
FIG. 19 is a front view of the exposure module where a front-side portion of the exposure module is viewed in the Y direction.
Figure 20:
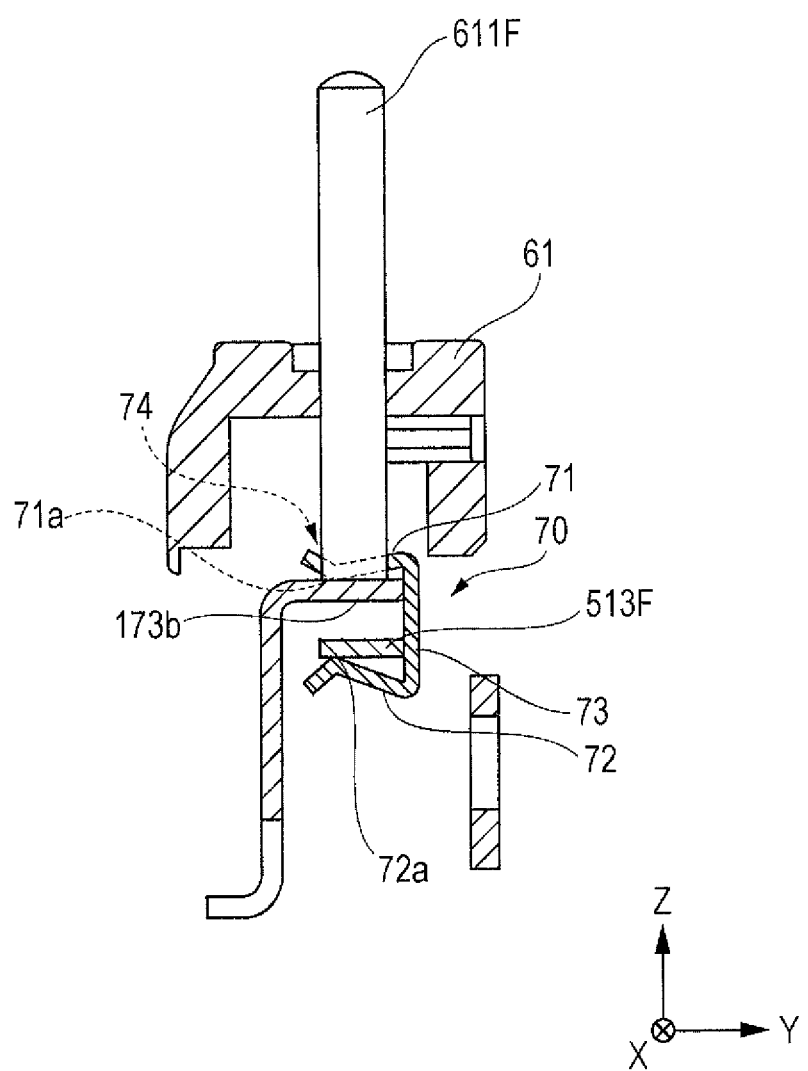
FIG. 20 is a cross sectional view of the exposure module taken along the line XX-XX in FIG. 19.

FIGS. 19 and 20 illustrate the details of the configuration of the front-side portion of the exposure module EM (see FIG. 3). FIG. 19 is a front view of the exposure module EM where a front-side portion of the exposure module EM is viewed in the Y direction. FIG. 20 is a cross sectional view of the exposure module EM taken along the line XX-XX in FIG. 19.

Figure 21:
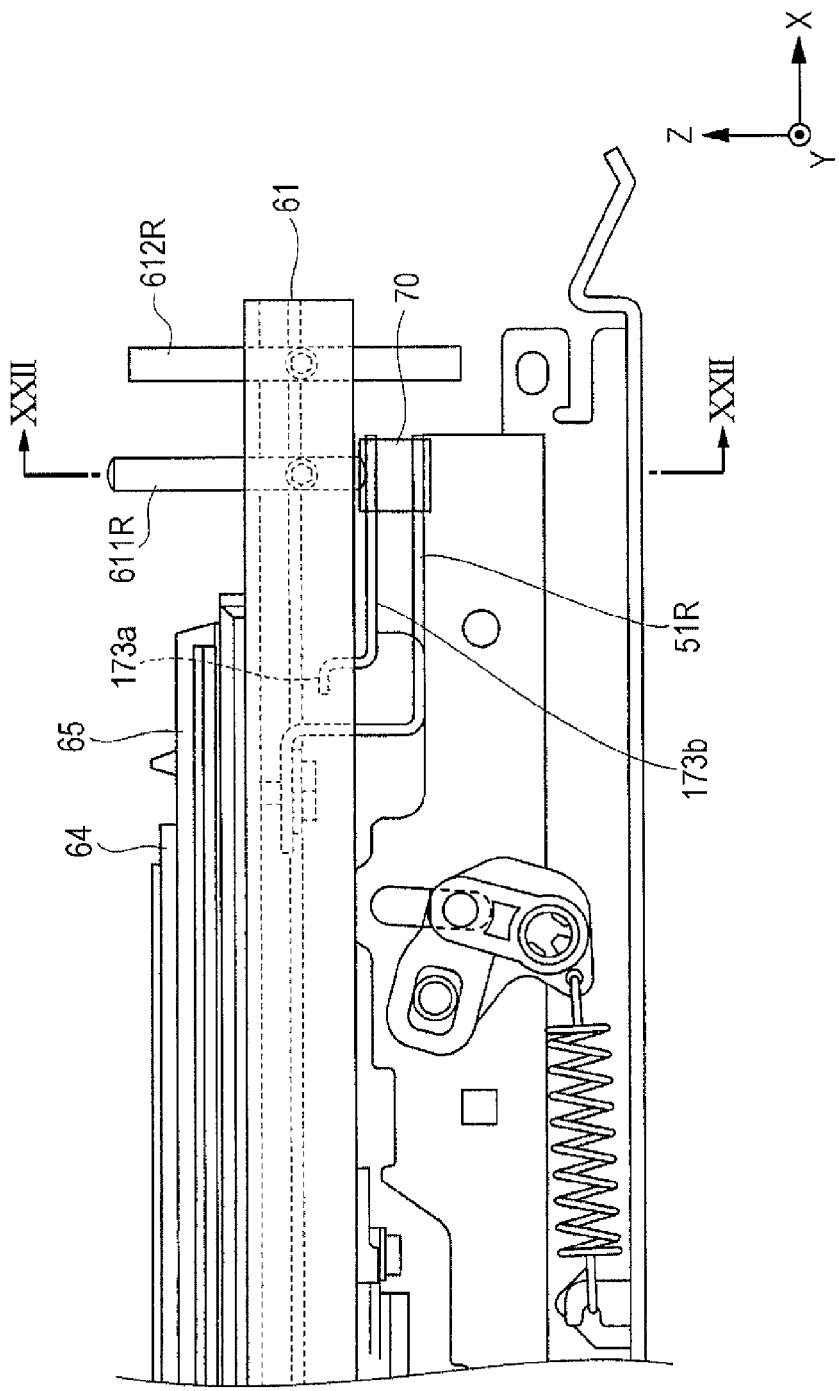
FIG. 21 is a front view of the exposure module where a rear-side portion of the exposure module is viewed in the Y direction.
Figure 22:
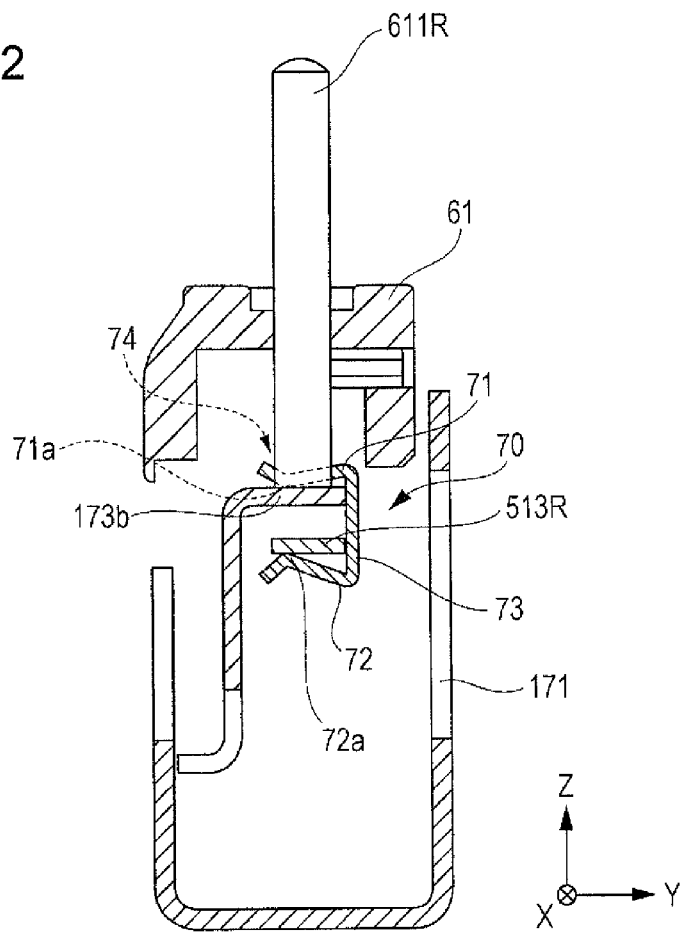
FIG. 22 is a cross sectional view of the exposure module taken along the line XXII-XXII of FIG. 21.

FIGS. 21 and 22 illustrate the details of the configuration of the rear-side portion of the exposure module EM. FIG. 21 is a front view of the exposure module EM where a rear-side portion of the exposure module EM is viewed in the Y direction. FIG. 22 is a cross sectional view of the exposure module EM taken along the line XXII-XXII of FIG. 21.

FIG. 19 to FIG. 22 illustrate the state where the LPH 14 included in the exposure module EM is in the above-described exposure position.

Figure 23:
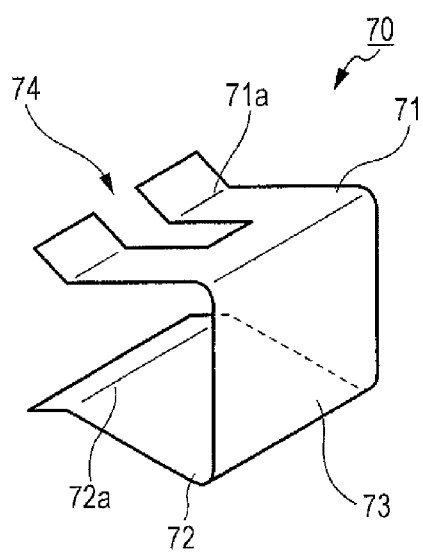
FIG. 23 is a perspective view of a configuration of a spring member.

FIG. 23 is a perspective view of a configuration of a spring member 70 (described below).

In the following description, the optical axis direction of the rod lens array 64 included in the LPH 14 illustrated in FIG. 3 and other drawings is referred to as a Z direction (corresponding to a second direction). A main-scanning direction, that is, the axial direction of the photoconductor drum 12 is referred to as an X direction (corresponding to a first direction). A sub-scanning direction, that is, the direction perpendicular to both the X and Z directions is referred to as a Y direction (corresponding to a third direction).

Firstly, referring to FIGS. 3 to 6, the configuration of the photoconductor module PM will be described.

In addition to the photoconductor drum 12, the charging device 13, and the cleaner 16, the photoconductor module PM also includes a front housing 81F and a rear housing 81R for holding the photoconductor drum 12, the charging device 13, and the cleaner 16. The front housing 81F and the rear housing 81R extend in the X direction and are integrated with a connection housing 81M that covers the charging device 13 and the cleaner 16 (see FIG. 1).

The photoconductor module PM includes a plate 82, which is attached to the front side of the front housing 81F, and a cover 83, which is attached to a front portion of the plate 82 and includes a handle used for removing or attaching the photoconductor module PM. A front positioning member 84 used for positioning the LPH 14 in the Y direction is attached to a lower rear portion of the plate 82. The plate 82 has multiple holes. When the photoconductor module PM is attached to the image forming apparatus 1 by being inserted into the image forming apparatus 1 from the front side, a front pin 1F attached to a front side frame (not illustrated) of the image forming apparatus 1 is fitted in at least one of the multiple holes in the plate 82, whereby the front side of the photoconductor module PM is positioned with respect to the image forming apparatus 1.

On the rear side of the photoconductor module PM, on the other hand, components such as the photoconductor drum 12, the charging device 13, and the cleaner 16 have a driven portion for receiving a driving power from the image forming apparatus 1. The driven portion includes components such as a coupling member. When the photoconductor module PM is attached to the image forming apparatus 1 by being inserted into the image forming apparatus 1 from the front side, the driven portion is fitted into a coupling member of a driving portion provided at the rear side of the image forming apparatus 1. On the rear side of the photoconductor module PM, a ring-shaped member 85 is attached to the rear side of the rear housing 81R. When the photoconductor module PM is attached to the image forming apparatus 1 by being inserted into the image forming apparatus 1 from the front side, the ring-shaped member 85 is fitted on a rear side frame (not illustrated) of the image forming apparatus 1, whereby the rear side of the photoconductor module PM is positioned with respect to the image forming apparatus 1.

In the photoconductor module PM, a cylindrical front flange 121F and a cylindrical rear flange 121R are pressure inserted into both end portions of the photoconductor drum 12 in the X direction. The front flange 121F and the rear flange 121R are rotatably supported by the cover 83 and the ring-shaped member 85. A front ball bearing (hereinafter referred to as a front BB) 122F is attached to the front flange 121F from the outer side and the rear ball bearing (hereinafter referred to as a rear BB) 122R is attached to the rear flange 121R from the outer side.

In this exemplary embodiment, the front BB 122F is attached to the front flange 121F with a slight clearance interposed therebetween and the rear BB 122R is attached to the rear flange 121R with a slight clearance interposed therebetween. On the other hand, the front BB 122F is closely attached to the front housing 81F and the rear BB 122R is closely attached to the rear housing 81R. Thus, the front BB 122F is fixed to the front housing 81F and the rear housing 122R is fixed to the rear housing 81R.

Here, although the front BB 122F is covered with the front housing 81F, the front housing 81F has openings at positions at which the front housing 81F faces the developing device 15 (see FIG. 1) and the LPH 14. In the same manner as in the front housing 81F, although the rear BB 122R is covered with the rear housing 81R, the rear housing 81R has openings at positions at which the rear housing 81R faces the developing device 15 (see FIG. 1) and the LPH 14. Thus, the outer peripheral surfaces of the front BB 122F and the rear BB 122R are exposed at positions at which they face the LPH 14 and the developing device 15. In this embodiment, the front BB 122F and the rear BB 122R are used for determining the position of the LPH 14 in the Z direction, which will be described below. The front BB 122F and the rear BB 122R are also used for positioning a development roller included in the developing device 15 (see FIG. 1).

Referring now to FIGS. 3 to 5 and FIGS. 7 to 18, the configuration of the exposure module EM will be described.

As described above, the exposure module EM includes the LPH 14 and the retractable mechanism 17. When the rear side of the retractable mechanism 17 is held by a rear holding member 1R attached to the rear side frame (not illustrated) of the image forming apparatus 1, the position of the rear side of the retractable mechanism 17 is determined with respect to the image forming apparatus 1. In addition, a fixing plate 176 having multiple holes is attached to a lower front portion of the retractable mechanism 17. After the exposure module EM is attached to the image forming apparatus 1 by being inserted into the image forming apparatus 1 from the front side, the fixing plate 176 is screwed to the front side frame (not illustrated) of the image forming apparatus 1 as a result of at least one screw being screwed into the corresponding hole or holes formed in the fixing plate 176. Consequently, the position of the front side of the retractable mechanism 17 is determined with respect to the image forming apparatus 1. In this manner, the exposure module EM is formed such that the LPH 14 is movable in the Z direction, that is, between the exposure position and the withdrawn position using the retractable mechanism 17 in the state where the retractable mechanism 17 is fixed to the image forming apparatus 1. While the LPH 14 is moved from the withdrawn position to the exposure position, the position of the LPH 14 in the Z direction is determined with respect to the photoconductor drum 12.

Referring now to FIGS. 8 to 10, generally, the configuration of the LPH 14 of the exposure module EM will be described.

A first front positioning pin 611F, which determines the position of the front side of the LPH 14 in the Z direction, and a second front positioning pin 612F, which determines the position of the front side of the LPH 14 in the X and Y directions, are attached to the front side of the housing 61 of the LPH 14. On the other hand, a first rear positioning pin 611R, which determines the position of the rear side of the LPH 14 in the Z direction, and a second rear positioning pin 612R, which determines the position of the rear side of the LPH 14 in the X and Y directions, are attached to the rear side of the housing 61 of the LPH 14.

Here, the first front positioning pin 611F, the first rear positioning pin 611R, the second front positioning pin 612F, and the second rear positioning pin 612R are cylindrical metal poles. Among these pins, the first front positioning pin 611F and the first rear positioning pin 611R protrude from a side of the housing 61 facing the photoconductor module PM (a Z side) and the opposite side (a −Z side) of the housing 61, the housing extending in the X direction.

In this embodiment, in each of the first front positioning pin 611F and the first rear positioning pin 611R, a portion protruding from the side of the housing 61 facing the photoconductor module PM (the Z side) is defined as a second protrusion and a portion protruding from the opposite side of the housing 61 (the −Z side) is defined as a first protrusion.

The first front positioning pin 611F and the first rear positioning pin 611R each have a hemispherical tip end. The second front positioning pin 612F and the second rear positioning pin 612R also protrude from the side of the housing 61 facing the photoconductor module PM (the Z side) and the opposite side (the −Z side). Unlike the first front positioning pin 611F and the first rear positioning pin 611R, the second front positioning pin 612F and the second rear positioning pin 612R each have a flat tip end.

The first front positioning pin 611F, the first rear positioning pin 611R, the second front positioning pin 612F, and the second rear positioning pin 612R are arranged such that the center axes of these pins are positioned on the line along which the rod lens array 64 is arranged or along the direction in which the LED chips are arranged. The first front positioning pin 611F and the first rear positioning pin 611R are disposed closer to the rod lens array 64 than the second front positioning pin 612F and the second rear positioning pin 612R.

The LPH 14 also includes a sliding member 67 for cleaning the rod lens array 64. The sliding member 67 is a long member configured to move in the X direction (the longitudinal direction of the LPH 14). The sliding member 67 includes a support portion 67*a* and a handle 67*b*. The support portion 67*a* is disposed on the rear side and supports a blade (not illustrated), which cleans a light emission surface of the rod lens array 64 by coming into contact with the light emission surface as the blade slides. The handle 67*b* is disposed on the front side and operated so as to be pulled out and withdrawn for cleaning the light emission surface. The blade is made of a material having elasticity such as polyurethane rubber. The support portion 67*a* is disposed so as to extend over from one side to another side of the holder 65. A guide, which is not illustrated, is attached to the inner side of the support portion 67*a* and is fitted in the guide grooves 65*a* (see FIG. 2) of the holder 65. A slide holding member 68, which supports the sliding member 67 such that the sliding member 67 is slidable over the housing 61, is disposed on the front side of the LPH 14. When the sliding member 67 is disposed so as to be capable of sliding in the X direction, the support portion 67*a* is also capable of sliding in the X direction. Thus, when the sliding member 67 is caused to slide in the X direction by operating the handle 67*b*, the blade moves while coming into contact with the upper surface of the rod lens array 64. Consequently, dust or other matters adhering to the upper surface of the rod lens array 64 is removed. When, for example, an image forming operation is performed, the sliding member 67 is positioned at the rearmost position of the LPH 14. When the sliding member 67 is positioned as above, the support portion 67*a* and the blade attached to the support portion 67*a* do not cover the rod lens array 64.

A front plate member 51F is attached to the front side of the housing 61 of the LPH 14. On the other hand, a rear plate member 51R is attached to the rear side of the housing 61 of the LPH 14.

The front plate member 51F and the rear plate member 51R are each formed by bending a sheet of metal such as stainless steel.

The front plate member 51F includes a first front extension 511F, which extends in the X direction, a second front extension 512F, which extends in the direction from an end of the first front extension 511F on the downstream side in the X direction, and a third front extension 513F, which extends in the −X direction from an end of the second front extension 512F on the upstream side in the Z direction.

Here, the front plate member 51F is attached to the housing 61 by fixing an end portion of the first front extension 511F on the upstream side in the X direction to a front-side portion of the housing 61 via a bolt (illustrated with dotted lines).

In the front plate member 51F according to the exemplary embodiment, the first front extension 511F and the third front extension 513F are disposed so as to face each other. In this example, the third front extension 513F is longer in the X direction than the first front extension 511F. An end portion of the third front extension 513F on the upstream side in the X direction faces the tip portion of the first front positioning pin 611F that is disposed on the front side of the housing 61 and protrudes in the direction.

The rear plate member 51R includes a first rear extension 511R, which extends in the X direction, a second rear extension 512R, which extends in the −Z direction from an end of the first rear extension 5118 on the downstream side in the X direction, and a third rear extension 513R, which extends in the X direction from an end of the second rear extension 512R on the upstream side in the Z direction.

The rear plate member 51R is attached to the housing 61 by fixing an end portion of the first rear extension 511R on the upstream side in the X direction to a rear portion of the housing 61 via a bolt (illustrated with dotted lines).

In the rear plate member 51R according to the exemplary embodiment, an end portion of the third rear extension 513R on the downstream side in the X direction faces the tip portion of the first rear positioning pin 611R that is disposed on the rear side of the housing 61 and protrudes in the −Z direction.

Referring now to FIGS. 11 to 18, generally, the configuration of the retractable mechanism 17 of the exposure module EM will be described in detail.

The retractable mechanism 17 includes a casing 171, a lever 172, and a link mechanism 173. The casing 171 extends in the X direction and has an angular U-shaped cross section taken along the Y-Z plane. The lever 172 is attached to the front side of the casing 171 and is rotated around the axis in the C and direction of arrow Ds. The link mechanism 173 is installed inside the casing 171 and raises and lowers holding portions 173*a* and support portions 173*b* in the Z direction with respect to the casing 171 in association with an operation performed on the lever 172. Here, the holding portions 173*a* and the support portions 173*b* are included in the raising-and-lowering member 306 illustrated in FIG. 13. The link mechanism 173 is configured to raise and lower the raising-and-lowering member 306.

In the exemplary embodiment, the exposure module EM in which the LPH 14 and the retractable mechanism 17 are integrated is formed such that the holding portions 173*a* disposed on both end portions of the link mechanism 173 in the X direction hold holdable portions (not illustrated), which are holes formed in the −Z side surface of the housing 61 of the LPH 14. In addition, the support portions 173b disposed on both end portions of the link mechanism 173 in the X direction support lower portions of the first front positioning pin 611F and the first rear positioning pin 611R (see FIG. 8) attached to the housing 61 of the LPH 14. In the retractable mechanism 17, when the lever 172 is moved in the direction of arrow C, the holding portions 173a and the support portions 173b move in the Z direction, whereas when the lever 172 is moved in the direction of arrow D, the holding portions 173a and the support portions 173b move in the −Z direction.

Thus, in the exposure module EM, when the lever 172 of the retractable mechanism 17 is moved in the direction of arrow C, the support portions 173b push the first front positioning pin 611F and the first rear positioning pin 611R up in the Z direction so that the LPH 14 moves upward (to the exposure position). On the other hand, when the lever 172 is moved in the direction of arrow D, the holding portions 173a withdraw the holdable portions (not illustrated) in the −Z direction so that the LPH 14 moves downward (to the withdrawn position).

A junction board 174 is attached to one surface of the casing 171 of the retractable mechanism 17 on the rear side. The junction board 174 is electrically connected to the LPH 14 when the LPH 14 is attached to the retractable mechanism 17. A power receiving connector 175 is attached to the rear side of the junction board 174. The power receiving connector 175 connects the junction board 174 and a power supply connector (not illustrated) provided to the image forming apparatus 1 when the exposure module EM including the retractable mechanism 17 is attached to the image forming apparatus 1. A fixing plate 176 having multiple holes is attached to the lower surface of the casing 171 of the retractable mechanism 17 on the front side. An insertion member 177, which protrudes in the X direction, is provided on the rear side of the casing 171 of the retractable mechanism 17. The insertion member 177 is used when the retractable mechanism 17 is attached to the rear holding member 1R (see FIG. 3).

As illustrated in FIG. 12, a front restricting member 178F is attached to an upper portion of the casing 171 of the retractable mechanism 17 on the front side. FIG. 11 illustrates the state where the front restricting member 178F is removed from the casing 171. The front restricting member 178F has a U-shaped groove that extends in the Y direction. The dimension of the U-shaped groove in the X direction is slightly larger than the diameter of the second front positioning pin 612F of the LPH 14. Thus, when the LPH 14 is attached to the retractable mechanism 17 to form the exposure module EM, a lower portion of the second front positioning pin 612F is inserted into the U-shaped groove of the front restricting member 178F. With there being the front restricting member 178F, movement of the second front positioning pin 612F in the Y and Z directions is not restricted but movement of the second front positioning pin 612F in the X direction is restricted.

Referring now to FIGS. 13 and 14, generally, the configuration of the raising-and-lowering member 306 included in the retractable mechanism 17 will be described.

The raising-and-lowering member 306, which is an example of a positioning member or an abutment member, extends in the X direction and is formed by, for example, performing punching and folding operations on a metal plate. The holding portion 173a and the support portion 173b, which is an example of a contact portion, on an upper front portion of the raising-and-lowering member 306 are separately provided. On the other hand, the holding portion 173a and the support portion 173b on an upper rear portion of the raising-and-lowering member 306 are integrally provided.

A front pin 306Fa that protrudes in the Y direction is attached to a front portion of the raising-and-lowering member 306 at a position closer to the X side (rear side) than the support portion 173b. In addition, a front long hole 306Fb is formed in a front portion of the raising-and-lowering member 306 at a position closer to X side (rear side) than the front pin 306Fa. The front long hole 306Fb extends in the Z direction and is inclined toward the X direction. Here, the front pin 306Fa is attached to a position adjacent to the lengthwise center of the front long hole 306Fb extending in the Z direction, the front long hole 306Fb being adjacent to and on the rear of the front pin 306Fa.

A front protruding portion 306Fc, which protrudes in the −Y direction, is provided in a front portion of the raising-and-lowering member 306 at a position closer to the rear side than the front long hole 306Fb. The front protruding portion 306Fc is formed by performing a bending operation.

As in the case of the front pin 306Fa, a rear pin 306Ra that protrudes in the Y direction is attached to a rear portion of the raising-and-lowering member 306 at a position closer to the −X side (front side) than the support portion 173b. In addition, a rear long hole 306Rb is formed in a rear portion of the raising-and-lowering member 306 at a position closer to the X side (rear side) than the rear pin 306Ra. The rear long hole 306Rb extends in the Z direction and is inclined toward the X direction. Here, the rear pin 306Ra is attached to a position adjacent to the lengthwise center of the rear long hole 306Rb extending in the Z direction, the rear long hole 306Rb being adjacent to and on the rear of the rear pin 306Ra.

A rear protruding portion 306Rc, which protrudes in the −Y direction, is provided in a rear portion of the raising-and-lowering member 306 at a position closer to the rear side than the rear long hole 306Rb. The rear protruding portion 306Rc is formed by performing a bending operation.

In the exemplary embodiment, the front long hole 306Fb and the rear long hole 306Rb of the raising-and-lowering member 306 have a linear shape. The word linear here means that the longitudinal direction of the holes formed in the raising-and-lowering member 306 extends in one direction (in this example, a direction that extends toward the Z direction but is inclined toward the X direction).

Referring now to FIGS. 15 to 18, generally, the configuration of the link mechanism 173 of the retractable mechanism 17 will be described.

The link mechanism 173 includes a first link member 301, a second link member 302, a center coil spring 303, a front coil spring 304F, a rear coil spring 304R, a front cam 305F, a rear cam 305R, and the raising-and-lowering member 306. The illustration of the front restricting member 172F is omitted in FIGS. 16A to 16C and the illustration of the raising-and-lowering member 306 is omitted in FIG. 17.

A cam 305, used as the front cam 305F or the rear cam 305R, includes a shaft holding opening 3051, a pin holding opening 3052, a protrusion holding opening 3053, and a spring holding opening 3054. The shaft holding opening 3051 is formed so as to penetrate the body in the Y direction. The pin holding opening 3052 is formed so as to penetrate the body in the Y direction at a position closer to the −X side (front side) than the shaft holding opening 3051. The protrusion holding opening 3053 is formed so as to penetrate the body in the Y direction at a position closer to the −Z side (lower side) than the shaft holding opening 3051. The spring holding opening 3054 is formed so as to penetrate the body in the Y direction at a position closer to the −X side (front side) and the −Z side (lower side) than the shaft holding opening 3051.

A shaft 172a, which extends in the Y and −Y directions, is inserted into the lever 172 so as to be rotatable. The lever 172 is attached to the front side of the casing 171 via the shaft 172a. In addition, a shaft 172b, which extends in the Y direction, is inserted into the lever 172 so as to be rotatable. The shaft 172b is attached to a front end portion of the first link member 301 extending in the X direction. In addition, a shaft 301a, which extends in the Y direction is disposed at a rear end portion of the first link member 301. The shaft 301a is rotatably attached to a front end of the second link member 302 extending in the X direction. Here, the second link member 302 has an L-shaped cross section taken along the Y-Z plane.

A first front long hole 302Fa and a second front long hole 302Fb, extending in the X direction, are formed in a front portion on the side surface of the second link member 302. Here, the first front long hole 302Fa is formed at a position closer to the Z side (upper side) than the second front long hole 302Fb. A first rear long hole 302Ra and a second rear long hole 302Rb, extending in the X direction, are formed in a rear portion on the side surface of the second link member 302. Here, the first rear long hole 302Ra is formed at a position closer to the Z side (upper side) than the second rear long hole 302Rb.

The center coil spring 303 is disposed at a middle portion of the casing 171 in the X direction so as to extend in the X direction. A front side hook of the center coil spring 303 is hooked on the second link member 302 and a rear side hook of the center coil spring 303 is hooked on the casing 171.

The front coil spring 304F and the front cam 305F are attached to the front side of the second link member 302 while the rear coil spring 304R and the rear cam 305R are attached to the rear side of the second link member 302.

Among these components, the front coil spring 304F is disposed on the front side of the casing 171 so as to extend in the X direction. A front side hook of the front coil spring 304F is hooked on the casing 171 while a rear side hook of the front coil spring 304F is hooked on the spring holding opening 3054 of the front cam 305F.

On the other hand, the rear coil spring 304R is disposed on the rear side of the casing 171 so as to extend in the X direction. A front side hook of the rear coil spring 304R is hooked on the casing 171 while a rear side hook of the rear coil spring 304R is hooked on the spring holding opening 3054 of the rear cam 305R.

The front cam 305F includes a front shaft 305Fa that extends in the Y direction and is fitted into the shaft holding opening 3051 of the front cam 305F. The front shaft 305Fa protrudes from both Y and −Y sides of the front cam 305F. A portion of the front shaft 305Fa protruding from the Y side is attached to a Y side wall of the casing 171 through the first front long hole 302Fa formed in the second link member 302. On the other hand, a portion of the front shaft 305Fa protruding from the −Y side is attached to a −Y side wall of the casing 171 through the front long hole 306Fb formed in the raising-and-lowering member 306. The front shaft 305Fa is inserted into the shaft holding opening 3051 of the front cam 305F and shaft holding openings (not illustrated) formed in the walls of the casing 171. Moreover, both end portions of the front shaft 305Fa are rotatably attached to the walls of the casing 171. Thus, the front cam 305F is capable of rotating around the front shaft 305Fa relative to the casing 171.

The front pin 306Fa of the raising-and-lowering member 306 is inserted into the pin holding opening 3052 of the front cam 305F. Here, the pin holding opening 3052 has an inner diameter that is slightly larger than the diameter of the front pin 306Fa. Thus, the front pin 306Fa is inserted into the pin holding opening 3052 of the front cam 305' with a clearance interposed therebetween.

A front protrusion 305Fb is inserted into the protrusion holding opening 3053 of the front cam 305F so as to protrude from the front cam 305F in the Y direction. The front protrusion 305Fb protrudes outside beyond the casing 171 in the Y direction through the second front long hole 302Fb of the second link member 302 and a long hole (not illustrated) formed in a Y side wall of the casing 171. The long hole formed in the Y side wall of the casing 171 has a substantially circular shape having its center at the position at which the front shaft 305Fa is attached to the casing 171.

As described above, the rear side hook of the front coil spring 304F is hooked on the spring holding opening 3054 of the front cam 305F.

The rear cam 305R includes a rear shaft 305Ra that extends in the Y direction and is fitted into the shaft holding opening 3051 of the rear cam 305B. The rear shaft 305Ra protrudes from both Y and −Y sides of the rear cam 305R. A portion of the rear shaft 305Ra protruding from the Y side is attached to the Y side wall of the casing 171 through the first rear long hole 302Ra formed in the second link member 302. On the other hand, a portion of the rear shaft 305Ra protruding from the −Y side is attached to the −Y side wall of the casing 171 via the rear long hole 306Rb formed in the raising-and-lowering member 306. The rear shaft 305Ra is inserted into the shaft holding opening 3051 of the rear cam 305R and shaft holding openings (not illustrated) formed in the walls of the casing 171. Moreover, both end portions of the rear shaft 305Ra are rotatably attached to the walls of the casing 171. Thus, the rear cam 305R is capable of rotating around the rear shaft 305Ra relative to the casing 171.

The rear pin 306Ra of the raising-and-lowering member 306 is inserted into the pin holding opening 3052 of the rear cam 305R. Here, the pin holding opening 3052 has an inner diameter that is slightly larger than the diameter of the rear pin 306Ra. Thus, the rear pin 306Ra is inserted into the pin holding opening 3052 of the rear cam 305R with a clearance interposed therebetween.

A rear protrusion 305Rb is inserted into the protrusion holding opening 3053 of the rear cam 305R so as to protrude from the rear cam 305R in the Y direction. The rear protrusion 305Rb also protrudes outside beyond the casing 171 in the Y direction through the second rear long hole 302Rb of the second link member 302 and a long hole (not illustrated) formed in the Y side wall of the casing 171. The long hole formed in the Y side wall of the casing 171 has a substantially circular shape having its center at the position at which the rear shaft 305Ra is attached to the casing 171.

As described above, the rear side hook of the rear coil spring 304R is hooked on the spring holding opening 3054 of the rear cam 305R.

A front leaf spring and a rear leaf spring (both are not illustrated), each having a folded portion on its −Y side, are respectively attached to the front side and the rear side of the raising-and-lowering member 306. The front leaf spring and the rear leaf spring are used together with the front protruding portion 306Fc and the rear protruding portion 306Rc of the raising-and-lowering member 306 to control the position of the raising-and-lowering member 306 in the Y direction with respect to the casing 171.

Referring now to FIGS. 10 and 19 to 23, generally, the configuration of the exposure module EM will be described in detail.

As described above, on the front side of the exposure module EM in which the LPH 14 and the retractable mechanism 17 are integrated together, the support portion 173b of the link mechanism 173 (see FIG. 11) of the retractable mechanism 17 supports the first front positioning pin 611F of the housing 61 of the LPH 14.

As described above, the front plate member 51F is disposed on the front side of the housing 61 of the LPH 14 so as to face the lower end of the first front positioning pin 611F. Specifically, the lower end of the first front positioning pin 611F and the third front extension 513F of the front plate member 51F face each other in a portion on the front side of the LPH 14.

Thus, on the front side of the exposure module EM, the third front extension 513F of the front plate member 51F of the LPH 14 faces the support portion 173b of the raising-and-lowering member 306 of the retractable mechanism 17.

In the exposure module EM according to the exemplary embodiment, a spring member 70 is disposed so as to clamp the third front extension 513F of the front plate member 51F and the support portion 173b of the raising-and-lowering member 306 together.

As described above, on the rear side of the exposure module EM, the support portion 173b of the raising-and-lowering member 306 of the retractable mechanism 17 supports the first rear positioning pin 611R of the housing 61 of the LPH 14.

As described above, the rear plate member 51R is disposed on the rear side of the housing 61 of the LPH 14 so as to face the lower end of the first rear positioning pin 611R. Specifically, on the rear side of the LPH 14, the lower end of the first rear positioning pin 611R faces the third rear extension 513R of the rear plate member 51R.

Thus, on the rear side of the exposure module EM, the third rear extension 513R of the rear plate member 51R of the LPH 14 faces the support portion 173b of the raising-and-lowering member 306 of the retractable mechanism 17.

In the exposure module EM according to the exemplary embodiment, a spring member 70 is disposed so as to clamp the third rear extension 513R of the rear plate member 51R and the support portion 173b of the raising-and-lowering member 306 together.

Referring to FIG. 23, the configuration of the spring members 70 will be described.

Each spring member 70 according to the exemplary embodiment is an example of a movement restricting member or an elastic member. Each spring member 70 includes a first plate portion 71, a second plate portion 72 that faces the first plate portion 71, and a third plate portion 73 that connects a first end of the first plate portion 71 to a first end of the second plate portion 72. As a whole, the spring member 70 has an angular U-shaped cross section. The spring member 70 according to the exemplary embodiment may be formed by performing operations such as punching and bending operations on a metal sheet made of a material such as stainless steel.

FIG. 23 illustrates a spring member 70 in a normal state without being elastically deformed by a pressing force or by other ways.

The first plate portion 71 has a flat rectangular shape. The first plate portion 71 extends from the first end, connected to the third plate portion 73, to a second end, opposite to the first end connected to the third plate portion 73, in such as manner as to reduce the distance between itself and the second plate portion 72. The first plate portion 71 also has a first bent portion 71a, at which the first plate portion 71 is bent in a direction away from the second plate portion 72, on its second end side.

The second plate portion 72 has a flat rectangular shape. The second plate portion 72 extends from the first end connected to the third plate portion 73 to a second end opposite to the first end connected to the third plate portion 73 in such a manner as to reduce the distance between itself and the first plate portion 71. The second plate portion 72 also has a second bent portion 72a, at which the second plate portion 72 is bent in a direction away from the first plate portion 71, on its second end side.

Here, while the spring member 70 is in the normal state, the distance (or the height of the third plate portion 73) between the first end of the first plate portion 71 and the first end of the second plate portion 72 is larger than the distance between the support portion 173b and the front plate member 51F of the exposure module EM, in which the LPH 14 and the retractable mechanism 17 are integrated, or the distance between the support portion 173b and the rear plate member 51R.

In addition, while the spring member 70 is in the normal state, the distance between the first bent portion 71a of the first plate portion 71 and the second bent portion 72a of the second plate portion 72 is smaller than the distance between the support portion 173b and the third front extension 513F of the front plate member 51F or the distance between the support portion 173b and the third rear extension 513R of the rear plate member 51R.

The first plate portion 71 has a cutout portion 74. The cutout portion 74 is formed by cutting out a portion of a metal sheet serving as the first plate portion 71 into a U shape from the second end side, on which the first bent portion 71a is formed, toward the first end, to which the third plate portion 73 is connected.

Here, the width of the cutout portion 74 is set to be larger than the diameter of the first front positioning pin 611F or the first rear positioning pin 611R (see FIG. 8) of the LPH 14.

Referring now to FIGS. 10 and 19 to 23, generally, a method of attaching the spring members 70 to the exposure module EM and the state of the spring members 70 attached to the exposure module EM will be described.

In the exposure module EM according to the exemplary embodiment, one of the spring members 70 is attached to the third front extension 513F of the front plate member 51F and the support portion 173b of the raising-and-lowering member 306, which face each other, from the downstream side in the Y direction. Similarly, the other spring member 70 is attached to the third rear extension 513R of the rear plate member 51R and the support portion 173b of the raising-and-lowering member 306, which face each other, from the downstream side in the Y direction.

As described above, the distance between the first bent portion 71a of the first plate portion 71 and the second bent portion 72a of the second plate portion 72 is set to be smaller than the distance between the support portion 173b and the third front extension 513F of the front plate member 51F. Thus, before the spring member 70 is attached to the third front extension 513F of the front plate member 51F and the support portion 173b of the raising-and-lowering member 306, the spring member 70 is deformed to increase the distance between the first plate portion 71 and the second plate portion 72.

Then, the spring member 70 is moved in the −Y direction and attached to the third front extension 513F of the front plate member 51F and the support portion 173b of the raising-and-lowering member 306 such that the third front extension 513F and the support portion 173b are inserted into a space between the first plate portion 71 and the second plate portion 72.

While the spring member 70 is being attached to the third front extension 513F of the front plate member 51F and the support portion 173b of the raising-and-lowering member 306, the first front positioning pin 611F supported by the support portion 173b enters the cutout portion 74 of the first plate portion 71 of the spring member 70.

Thus, in the exposure module EM, the spring member 70 is attachable so as to be adjacent to the first front positioning pin 611F.

When the exposure module EM is in the state where the spring member 70 is attached to and clamps together the third front extension 513F of the front plate member 51F and the support portion 173b of the raising-and-lowering member 306, the first bent portion 71a of the first plate portion 71 of the spring member 70 is in contact with the support portion 173b and the second bent portion 72a of the second plate portion 72 is in contact with the third front extension 513F.

In this state, the distance between the first bent portion 71a of the first plate portion 71 and the second bent portion 72a of the second plate portion 72 is larger than that in the case where the spring member 70 is in the normal state where the spring member 70 is not elastically deformed. In this state, the spring member 70 exerts its elastic force in such a direction as to reduce the distance between the first plate portion 71 and the second plate portion 72. Thus, in the exposure module EM, a force is applied in such a direction as to reduce the distance between the third front extension 513F of the front plate member 51F and the support portion 173b of the raising-and-lowering member 306.

As a result, movement of the LPH 14 relative to the retractable mechanism 17 is restricted on the front side of the exposure module EM. Particularly, in the above-described example, the spring member 70 that exerts an elastic force in such a direction as to reduce the distance between the first plate portion 71 and the second plate portion 72 (that is, in the Z direction) is moved in the −Y direction for attachment. Thus, in this example, the movement of the LPH 14 relative to the retractable mechanism 17 in the Z and Y directions is restricted.

Similarly, before the spring member 70 is attached to the third rear extension 513R of the rear plate member 51R and the support portion 173b of the raising-and-lowering member 306, the spring member 70 is deformed to increase the distance between the first plate portion 71 and the second plate portion 72.

Then, the spring member 70 is moved in the −Y direction and attached to the third rear extension 513R of the rear plate member 51R and the support portion 173b of the raising-and-lowering member 306 such that the third rear extension 513R and the support portion 173b are inserted into a space between the first plate portion 71 and the second plate portion 72.

While the spring member 70 is being attached to the third rear extension 513R of the rear plate member 51R and the support portion 173b of the raising-and-lowering member 306, the first rear positioning pin 611R supported by the support portion 173b enters the cutout portion 74 of the first plate portion 71 of the spring member 70.

Thus, in the exposure module EM, the spring member 70 is attachable so as to be adjacent to the first rear positioning pin 611R.

When the exposure module EM is in the state where the spring member 70 is attached to and clamps together the third rear extension 513R of the rear plate member 51R and the support portion 173b of the raising-and-lowering member 306, the first bent portion 71a of the first plate portion 71 of the spring member 70 is in contact with the support portion 173b and the second bent portion 72a of the second plate portion 72 is in contact with the third rear extension 513R.

In this state, the distance between the first bent portion 71a of the first plate portion 71 and the second bent portion 72a of the second plate portion 72 is larger than that in the case where the spring member 70 is in the normal state where the spring member 70 is not elastically deformed. In this state, the spring member 70 exerts its elastic force in such a direction as to reduce the distance between the first plate portion 71 and the second plate portion 72. Thus, in the exposure module EM, a force is applied in such a direction as to reduce the distance between the third rear extension 513R of the rear plate member 51R and the support portion 173b of the raising-and-lowering member 306.

As a result, movement of the LPH 14 relative to the retractable mechanism 17 is restricted on the rear side of the exposure module EM. Particularly, in the above-described example, the spring member 70 that exerts an elastic force in such a direction as to reduce the distance between the first plate portion 71 and the second plate portion 72 (that is, in the Z direction) is moved in the −Y direction for attachment. Thus, in this example, the movement of the LPH 14 relative to the retractable mechanism 17 in the Z and Y directions is restricted.

As described above, in the exemplary embodiment, the spring members 70 are attached to the exposure module EM at positions adjacent to the first front positioning pin 611F and the first rear positioning pin 611R. Thus, a contact force between the LPH 14 and the retractable mechanism 17 at the positions adjacent to the first front positioning pin 611F and the first rear positioning pin 611R of the exposure module EM is made different from that in the case where the spring members 70 are not provided. Moreover, the movement of the LPH 14 relative to the retractable mechanism 17 is restricted at the positions adjacent to the first front positioning pin 611F and the first rear positioning pin 611R of the exposure module EM.

Consequently, in the exposure module EM according to the exemplary embodiment, the characteristic frequency of the LPH 14 is made adjustable.

The adjustment of the characteristic frequency of the LPH 14 using the spring members 70 will be described below.

Figure 24:
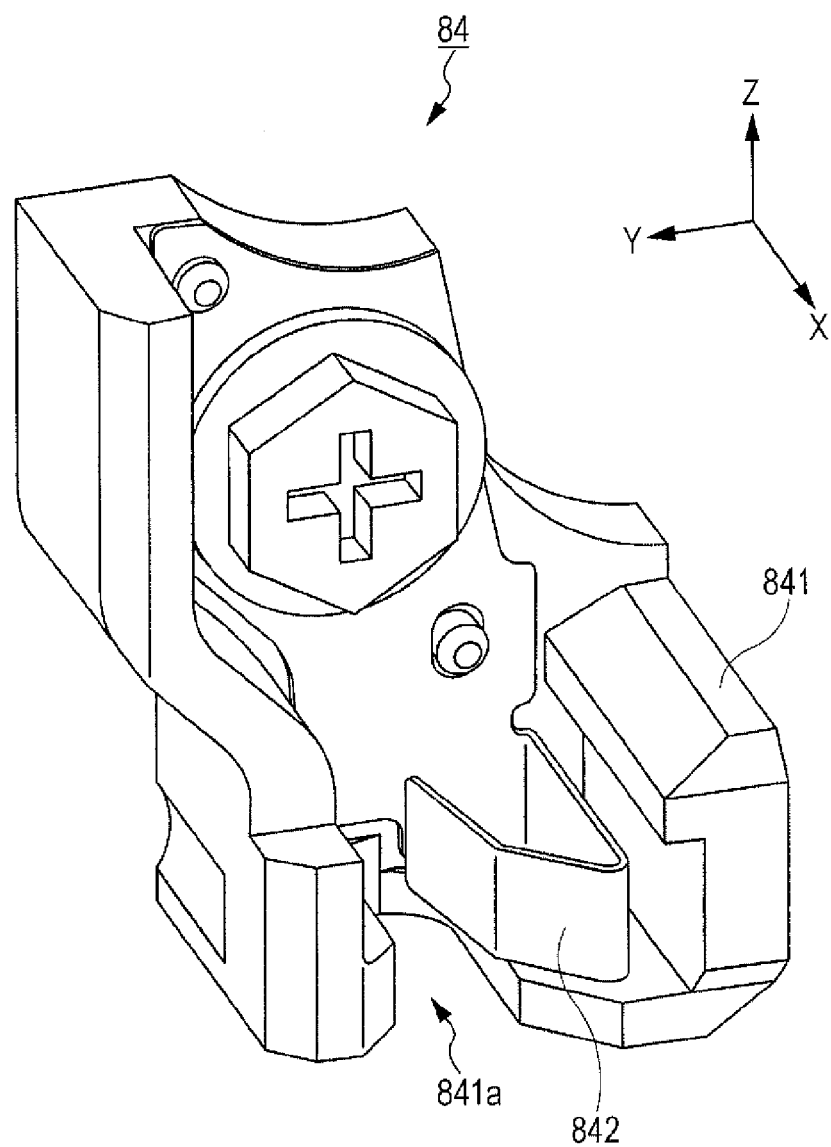
FIG. 24 is a perspective view of a configuration of a front positioning member attached to a plate of the photoconductor module.

FIG. 24 is a perspective view of a configuration of the front positioning member 84 attached to the plate 82 (see FIG. 4) of the photoconductor module PM. The front positioning member 84 includes a bracket 841 and a leaf spring 842 screwed to the bracket 841. The bracket 841 has a U-shaped receiving groove 841a at a lower portion, the groove 841a being open in the X direction. The screw is also used to attach the front positioning member 84 to the plate 82. An upper portion of the second front positioning pin 612F of the LPH 14 is inserted into the receiving groove 841a of the bracket 841 when the photoconductor module PM is attached to the image forming apparatus 1 (see FIG. 4). The leaf spring 842 presses the second front positioning pin 612F in the Y direction when the second front positioning pin 612F is inserted into the receiving groove 841a of the bracket 841.

Figure 25:
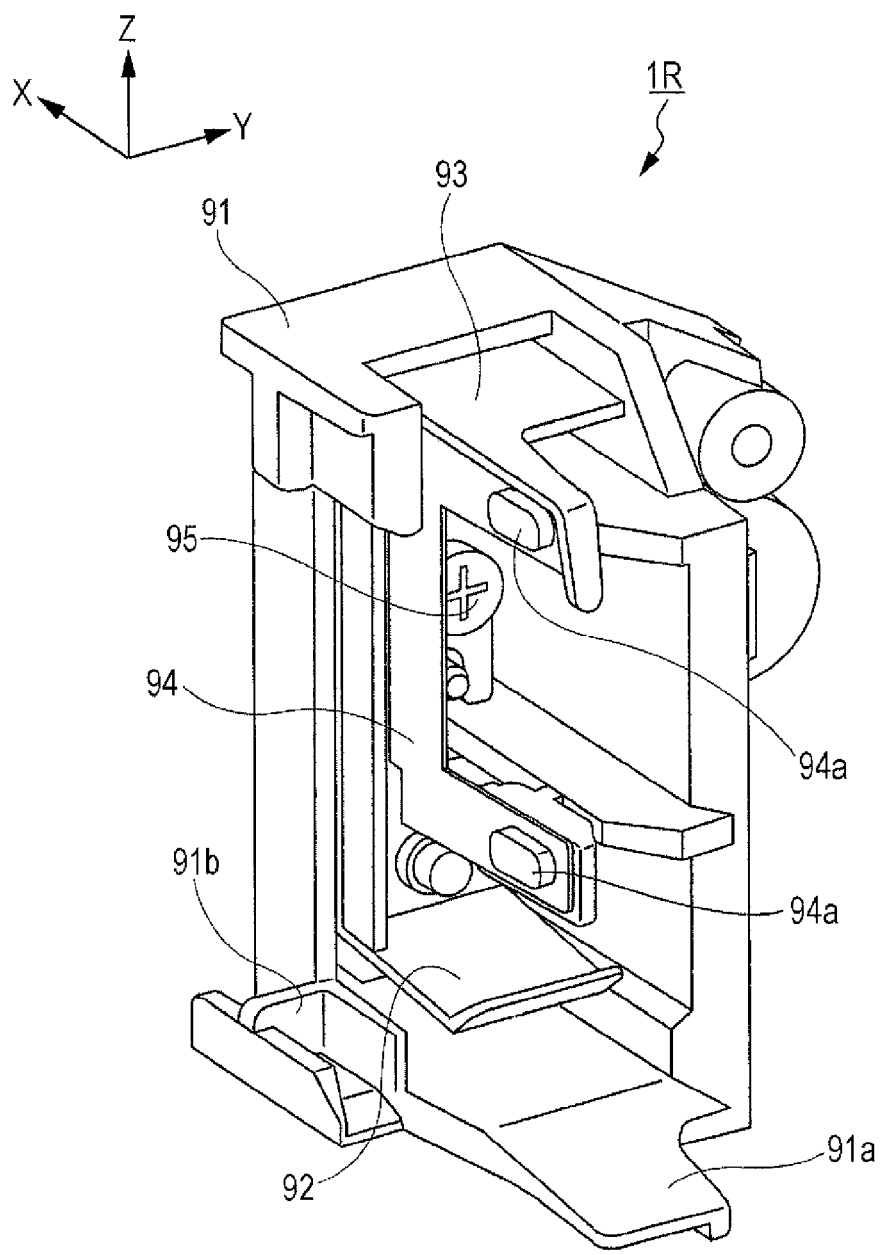
FIG. 25 is a perspective view of a configuration of a rear holding member attached to a rear side frame of the image forming apparatus.

On the other hand, FIG. 25 is a perspective view of a configuration of the rear holding member 1R attached to a rear side frame of the image forming apparatus 1. The rear holding member 1R includes a bracket 91, a first leaf spring 92, a hooked arm 93, a second leaf spring 94, and a screw 95. The first leaf spring 92 is made of metal and attached to a lower front portion of the bracket 91. The hooked arm 93 is attached to an upper portion of the bracket 91 so as to be swingable in the Y direction. The second leaf spring 94 is made of metal and disposed so as to be in contact with the arm 93 attached to the bracket 91. The screw 95 fixes the first leaf spring 92, the arm 93, and the second leaf spring 94 to the bracket 91. Slide members 94a made of resin or other materials are attached to free end portions of the second leaf spring 94. The insertion member 177 (see FIG. 11) disposed on the rear side of the casing 171 of the retractable mechanism 17 is inserted into a space between the bracket 91 and the first leaf spring 92 when the exposure module EM is attached to the image forming apparatus 1. Moreover, an upper portion of the second rear positioning pin 612R (see FIG. 8) of the LPH 14 is fitted into a space between the bracket 91 and the arm 93 when the exposure module EM is attached to the image forming apparatus 1. When the second rear positioning pin 612R is fitted into the space between the bracket 91 and the arm 93, the second leaf spring 94 presses the second rear positioning pin 612R in the Y direction. In the state where the second rear positioning pin 612R is inserted, the slide members 94a of the second leaf spring 94 reduce the frictional force that occurs between the second rear positioning pin 612R and the arm 93 while the LPH 14 moves between the withdrawn position and the exposure position.

The rear holding member 1R also includes a casing guide portion 91a at a lower portion of the bracket 91. The casing guide portion 91a is formed so as to be inclined in the Y and Z directions and guides the insertion member 177 when the exposure module EM is inserted into the image forming apparatus 1. The rear holding member 1R also includes a board holding portion 91b at a lower portion of the bracket 91. The board holding portion 91b holds a junction board 174 (see FIG. 7) attached to the retractable mechanism 17 when the exposure module EM is inserted into the image forming apparatus 1. The board holding portion 91b has a slope inclined toward the Z direction on the front side so as to guide the junction board 174 while the junction board 174 is inserted.

Referring now to FIGS. 3 to 25, the procedure of attaching the exposure module EM to the image forming apparatus 1 and the procedure of attaching the photoconductor module PM to the image forming apparatus 1 to which the exposure module EM has been attached will be described.

Firstly, the exposure module EM is inserted, from the front side of the image forming apparatus 1, into the image forming apparatus 1 to which the exposure module EM and the photoconductor module PM have not been attached. Here, the lever 172 of the retractable mechanism 17 included in the exposure module EM is substantially parallel to the casing 171 after being brought down in the direction of arrow D in FIG. 7, so that the LPH 14 is withdrawn in the retractable mechanism 17. The inserted exposure module EM moves along the guide (not illustrated) provided in the image forming apparatus 1 from the front side (first end side) to the rear side (second end side).

Then, as a result of the insertion, the rear side of the exposure module EM is fitted into the rear holding member 1R disposed on a rear side frame of the image forming apparatus 1. Specifically, the insertion member 177 disposed on the rear side of the retractable mechanism 17 is interposed between the bracket 91 and the first leaf spring 92 of the rear holding member 1R and thus the rear side of the retractable mechanism 17 is fixed to the image forming apparatus 1. In addition, the second rear positioning pin 612R disposed on the rear side of the LPH 14 is interposed between the bracket 91 and the arm 93 of the rear holding member 1R and the arm 93 is pressed by the second leaf spring 94 in the Y direction, so that the position of the rear side of the LPH 14 in the Y direction is determined. Moreover, the power receiving connector 175 disposed on the rear side of the retractable mechanism 17 is fitted into a power supply connector (not illustrated) disposed on the rear side of the image forming apparatus 1 and thus the power receiving connector 175 and the power supply connector are electrically connected together. On the other hand, the fixing plate 176 disposed on the front side of the retractable mechanism 17 and a front side frame (not illustrated) of the image forming apparatus 1 face each other and the fixing plate 176 is screwed to the front side frame. In this manner, the position of the retractable mechanism 17 is determined with respect to the image forming apparatus 1 by fixing the rear side of the retractable mechanism 17 to the rear holding member 1R disposed on the rear side frame of the image forming apparatus 1 and fixing the front side of the retractable mechanism 17 to the front side frame of the image forming apparatus 1. Moreover, since the front restricting member 178F of the retractable mechanism 17 fixed to the image forming apparatus 1 prevents the LPH 14 from moving in the X direction via the second front positioning pin 612F, the position of the LPH 14 in the X direction is determined.

Thereafter, the photoconductor module PM is inserted, from the front side of the image forming apparatus 1, into the image forming apparatus 1 to which the exposure module EM has been attached in the above described manner. At this time, the lever 172 of the retractable mechanism 17 included in the exposure module EM remains brought down in the direction of arrow D and the LPH 14 remains withdrawn in the retractable mechanism 17. Since the lever 172 has been brought down in the direction of arrow D, the lever 172 does not block the entrance of the photoconductor module PM. The inserted photoconductor module PM moves along a guide (not illustrated) provided in the image forming apparatus 1 from the front side to the rear side.

As a result of the insertion, the ring-shaped member 85 disposed on the rear side of the photoconductor module PM is fitted into the rear side frame (not illustrated) of the image forming apparatus 1. In addition, the front pin 1F disposed on the front side frame (not illustrated) of the image forming apparatus 1 is fitted into a hole of the plate 82 disposed on the front side of the photoconductor module PM. Furthermore, a driven portion (a coupling member) disposed on the rear side of the photoconductor module PM is fitted into a driving portion (another coupling member) disposed on the rear side of the image forming apparatus 1. In this manner, the position of the photoconductor module PM is determined with respect to the image forming apparatus 1 by fixing the rear side of the photoconductor module PM to the rear side frame of the image forming apparatus 1 and fixing the front side of the photoconductor module PM to the front pin 1F of the front side frame of the image forming apparatus 1.

As a result of the insertion of the photoconductor module PM, the second front positioning pin 612F disposed on the front side of the LPH 14 is fitted into the receiving groove 841a of the front positioning member 84 disposed on the front side of the photoconductor module PM. In addition, when the leaf spring 842 presses the second front positioning pin 612F in the Y direction, the position of front side of the LPH 14 in the Y direction is determined. On the rear side of the image forming apparatus 1, the rear holding member 1R has already determined the position of the rear side of the LPH 14 in the Y direction via the second rear positioning pin 612R. As described above, the rear holding member 1R disposed on the rear side frame of the image forming apparatus 1 prevents the second rear positioning pin 612R of the LPH 14 from moving in the Y direction and the front positioning member 84 attached to the plate 82 of the photoconductor module PM prevents the second front positioning pin 612F of the LPH 14 from moving in the Y direction, so that the position of the LPH 14 in the Y direction is determined.

After the photoconductor module PM has been attached to the image forming apparatus 1, the lever 172 of the retractable mechanism 17 of the exposure module EM is brought up in the direction of arrow C. In the state where the lever 172 is substantially perpendicular to the casing 171, the photoconductor module PM is fixed to the image forming apparatus 1 using a fixing member (not illustrated) provided in the image forming apparatus 1. As a result of the rise of the lever 172, the link mechanism 173 operates and the holding portions 173a and the support portions 173b rise in the z direction. When the holding portions 173a and the support portions 173b rise in the Z direction, the LPH 14 supported by the support portions 173b rises in the Z direction. At this time, a lower portion of the second front positioning pin 612F disposed on the front side of the LPH 14 is prevented from moving in the X direction by the front restricting member 178F attached to the casing 171 of the retractable mechanism 17. In addition, an upper portion of the second front positioning pin 612F is prevented from moving in the Y direction by the front positioning member 84 attached to the photoconductor module PM and an upper portion and a lower portion of the second rear positioning pin 612R are prevented from moving in the Y direction by the rear holding member 1R attached to the rear side frame of the image forming apparatus 1. Thus, the LPH 14 moves in the Z direction while being prevented from moving in the X and Y directions, in other words, while the position of the LPH 14 in the X and Y directions is fixed. At this time, the LPH 14 is pressed by a spring force in the Y direction but not pressed by a spring force in the X direction. Thus, the LPH 14 is raised in the Z direction with a force that is smaller than that in the case where the LPH 14 is pressed by a spring force in both X and Y directions.

When the LPH 14 is raised in the Z direction, the first front positioning pin 611F disposed on the front side of the LPH 14 abuts against the front BB 122F disposed on the front side of the photoconductor module PM and the first rear positioning pin 611R disposed on the rear side of the LPH 14 abuts against the rear BB 122R disposed on the rear side of the photoconductor module PM. In this manner, the front BB 122F and the rear BB 122R disposed on both end portions of the photoconductor drum 12 of the photoconductor module PM in the X direction prevent the LPH 14 from moving in the Z direction via the first front positioning pin 611F and the first rear positioning pin 611R, so that the position of the LPH 14 in the Z direction is determined.

Thus, the position of the LPH 14 set in the exposure position is determined with respect to the photoconductor drum 12 in the manner as described below.

Firstly, the position of the LPH 14 in the X direction is determined as a result of a lower portion of the second front positioning pin 612F being held by the front restricting member 178F of the retractable mechanism 17 fixed to the image forming apparatus 1.

The position of the LPH 14 in the Y direction is determined as a result of an upper portion of the second front positioning pin 612F being held by the front positioning member 84 of the photoconductor module PM fixed to the image forming apparatus 1 and as a result of an upper portion and a lower portion of the second rear positioning pin 612R being held by the rear holding member 1R fixed to the rear side frame of the image forming apparatus 1.

The position of the LPH 14 in the Z direction is determined as a result of the first front positioning pin 611F and the first rear positioning pin 611R being respectively pressed against the front BB 122F and the rear BB 122R of the photoconductor module PM fixed to the image forming apparatus 1.

That is, the positions of both front and rear sides of the LPH 14 in the X direction relative to the photoconductor drum 12 are determined using the retractable mechanism 17 as a reference. The positions of both front and rear sides of the LPH 14 in the Z direction relative to the photoconductor drum 12 are determined using the photoconductor module PM as a reference. On the other hand, the position of the front side of the LPH 14 in the Y direction relative to the photoconductor drum 12 is determined using the photoconductor module PM as a reference, while the position of the rear side of the LPH 14 in the Y direction relative to the photoconductor drum 12 is determined using the image forming apparatus 1 as a reference.

The removal of the photoconductor module PM and the exposure module EM from the image forming apparatus 1 is performed in the order opposite to that described above. Specifically, firstly, a fixing member (not illustrated) of the image forming apparatus 1 is unlocked and the lever 172 of the retractable mechanism 17 is rotated in the direction of arrow D in FIG. 7. Subsequently, the photoconductor module PM is pulled from the rear side to the front side of the image forming apparatus 1. Screws or the like are then removed and the exposure module EM is pulled from the rear side to the front side of the image forming apparatus 1.

In the exemplary embodiment, the LPH 14 is moved to the withdrawn position or the exposure position by manually operating the lever 172 of the retractable mechanism 17 of the exposure module EM. In the normal state of the retractable mechanism 17 according to the exemplary embodiment, the LPH 14 is in a standby position between the withdrawn position and the exposure position. While the LPH 14 is in the standby position, the lever 172 is inclined as illustrated in FIGS. 7 and 11. This positioning is for, for example, reducing a force required to rotate the lever 172 compared to that when the LPH 14 in the exposure position is withdrawn to the withdrawn position or reducing an impact exerted on the LPH 14 compared to that when the LPH 14 in the exposure position is released from the pressure in the Z direction.

FIGS. 26A, 26B, and 26C respectively illustrate the states of the retractable mechanism 17 when the LPH 14 is in the exposure position, the standby position, and the withdrawn position. Here, FIG. 26A illustrates the state of the retractable mechanism 17 when bringing the LPH 14 to be in the exposure position, FIG. 263 illustrates the state of the retractable mechanism 17 when bringing the LPH 14 to be in the standby position, and FIG. 26C illustrates the state of the retractable mechanism 17 when bringing the LPH 14 to be in the withdrawn position. In FIGS. 26A, 263, and 26C, the illustration of the raising-and-lowering member 306 of the retractable mechanism 17 is omitted.

Figure 28A:
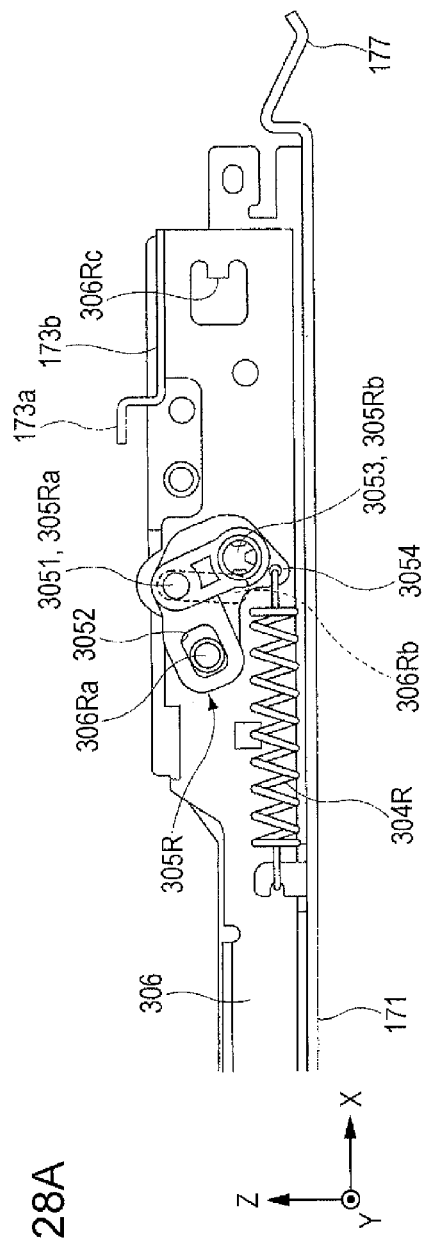
FIGS. 28A and 28B illustrate the states of the rear side of the retractable mechanism.
Figure 28B:
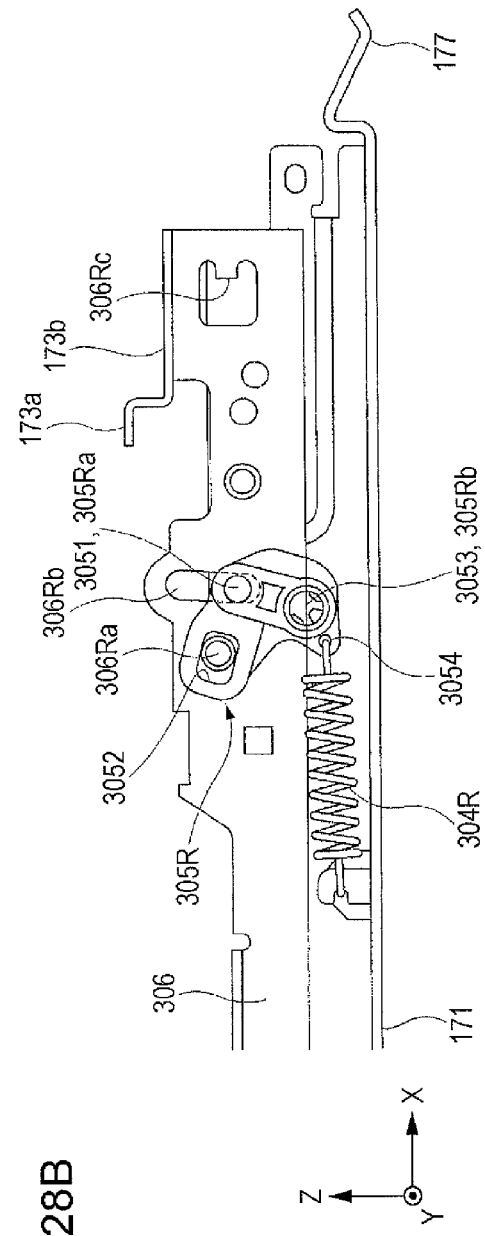

FIGS. 27A and 27B illustrate the states of the front side of the retractable mechanism 17. FIG. 27A illustrates the state of the front side of the retractable mechanism 17 when the LPH 14 is in the withdrawn position, while FIG. 27B illustrates the state of the front side of the retractable mechanism 17 when the LPH 14 is in the exposure position. FIGS. 28A and 28B illustrate the states of the rear side of the retractable mechanism 17. FIG. 28A illustrates the state of the rear side of the retractable mechanism 17 when the LPH 14 is in the withdrawn position, while FIG. 28B illustrates the state of the rear side of the retractable mechanism 17 when the LPH 14 is in the exposure position. In FIGS. 27A, 27B, 28A, and 28B, the illustrations of the first link member 301 and the second link member 302 are omitted.

Firstly, referring to FIG. 26B, the state of the retractable mechanism 17 when bringing the LPH 14 to be in the standby position will be described.

In the retractable mechanism 17, the second link member 302 is pulled by the center coil spring 303 in the X direction (rearward) relative to the casing 171. Thus, the front protrusion 305Fb abuts against the front end of the second front long hole 302Fb of the second link member 302 and the front cam 305F receives a force that is to rotate the front cam 305F counterclockwise in FIG. 26B around the front shaft 305Fa. In addition, the rear protrusion 305Rb abuts against the front end of the second rear long hole 302Rb of the second link member 302 and the rear cam 305R also receives a force that is to rotate the rear cam 305R counterclockwise in FIG. 26B around the rear shaft 305Ra.

On the other hand, the front cam 305F is pulled by the front coil spring 304F in the −X direction (frontward) relative to the casing 171. Thus, the front cam 305F receives a force that is to rotate the front cam 305F clockwise in FIG. 26B around the front shaft 305Fa. The rear cam 305R is also pulled by the rear coil spring 304R in the −X direction (frontward) relative to the casing 171. Thus, the rear cam 305R also receives a force that is to rotate the rear cam 305R clockwise in FIG. 26B around the rear shaft 305Ra.

As a result, the front cam 305F and the rear cam 305R become stationary at such positions at which the force of the center coil spring 303 is balanced with the forces of the front coil spring 304F and the rear coil spring 304R. At this time, in the raising-and-lowering member 306 (not illustrated in FIGS. 26A, 263, and 26C), the front pin 306Fa is pressed by a −Z, side inner wall surface of the pin holding opening 3052 of the front cam 305F and the rear pin 306Ra is pressed by a −Z side inner wall surface of the pin holding opening 3052 of the rear cam 305R. Then, the holding portions 173a and the support portions 173b disposed on the front and rear sides of the raising-and-lowering member 306 stop in the state where the raising-and-lowering member 306 is in a first position with respect to the casing 171. Here, the height of the holding portion 173a on the front side in the Z direction is the same as the height of the holding portion 173a on the rear side in the Z direction. Moreover, the height of the support portion 173b on the front side in the Z direction is the same as the height of the support portion 173b on the rear side in the Z direction.

At this time, the front shaft 305Fa of the front cam 305F is positioned at substantially the middle of the front long hole 306Fb of the raising-and-lowering member 306 and at substantially the middle of the first front long hole 302Fa of the second link member 302. On the other hand, the rear shaft 305Ra of the rear cam 305R is positioned at substantially the middle of the rear long hole 306Rb of the raising-and-lowering member 306 and at substantially the middle of the second rear long hole 302Rb of the second link member 302.

Consequently, when the LPH 14 is in the standby position, the front shaft 305Fa of the front cam 305F and the front pin 306Fa of the raising-and-lowering member 306 are in a stationary state while being arranged along the X direction. In addition, when the LPH 14 is in the standby position, the rear shaft 305Ra of the rear cam 305R and the rear pin 306Ra of the raising-and-lowering member 306 are in a stationary state while being arranged along the X direction.

In this state, the lever 172 connected to the second link member 302 via the first link member 301 is in the stationary state while being inclined (at approximately 45°) with respect to the X and Z directions around the shaft 172a.

Referring now to FIGS. 26A, 26C, 27B, and 28B, the operation of the retractable mechanism 17 when switching the LPH 14 from the standby position to the exposure position and the state of the retractable mechanism 17 when bringing the LPH 14 to the exposure position will be described.

When the LPH 14 (not illustrated) is moved from the standby position to the exposure position, the lever 172 is operated in the direction of arrow C. Thus, the lever 172 is rotated around the shaft 172a. As the lever 172 is rotated, the shaft 172b attached to the lever 172 is also rotated in the direction of arrow C. Consequently, the first link member 301 attached to the shaft 172b is pulled in the −X direction (frontward). When the first link member 301 is pulled frontward, the second link member 302 connected to the first link member 301 via the shaft 301a moves in the −X direction against the compressive force of the center coil spring 303. With the movement of the second link member 302 in the −X direction (frontward), the first front long hole 302Fa, the second front long hole 302Fb, the first rear long hole 302Ra, and the second rear long hole 302Rb of the second link member 302 also move in the −X direction (frontward).

At this time, the front cam 305F is pulled in the −X direction (frontward) by the front coil spring 304F and the second front long hole 302Fb of the second link member 302, against which the front protrusion 305Fb attached to the front cam 305F has abutted, is moved in the −X direction (frontward). Thus, the front cam 305F rotates clockwise in the drawings around the front shaft 305Fa while keeping the front protrusion 305Fb in the state of abutting against the front end of the second front long hole 302Fb.

On the other hand, the rear cam 305R is also pulled in the −X direction (frontward) by the rear coil spring 304R and the second rear long hole 302Rb of the second link member 302 against which the rear protrusion 305Rb attached to the rear cam 305R has abutted is moved in the −X direction (frontward). Thus, the rear cam 305R rotates clockwise in the drawings around the rear shaft 305Ra while keeping the rear protrusion 305Rb in the state of abutting against the front end of the second rear long hole 302Rb.

Meanwhile, the front cam 305F and the rear cam 305R rotate clockwise concurrently at the same angle together with the movement of the second link member 302 in the −X direction (frontward).

As a result of the rotation of the front cam 305F and the rear cam 305R, in the raising-and-lowering member 306, the front pin 306Fa is pressed by a −Z side inner wall surface of the pin holding opening 3052 of the front cam 305F and the rear pin 306Ra is pressed by a −Z side inner wall surface of the pin holding opening 3052 of the rear cam 305R.

Since the front pin 306Fa and the rear pin 306Ra are pressed in the Z direction in this manner, the raising-and-lowering member 306 to which the front pin 306Fa and the rear pin 306Ra are attached is pushed upward in the Z direction.

Specifically, the raising-and-lowering member 306 rises in the Z direction from the standby position while keeping the holding portions 173a and the support portions 173b on the front and rear sides horizontal, moves to a second position, at which the raising-and-lowering member 306 is farther from the casing 171 than when it is in the above-described first position, and stops at the second position. Here, the holding portion 173a on the front side is positioned at the same height as the holding portion 173a on the rear side in the Z direction and the support portion 173b on the front side is positioned at the same height as the support portion 173b on the rear side in the Z direction.

At this time, the front shaft 305Fa of the front cam 305F is positioned at a position on the −Z side (lower side) with respect to the middle of the front long hole 306Fa of the raising-and-lowering member 306 and on the X side (rear side) of the first front long hole 302Fa of the second link member 302. On the other hand, the rear shaft 305Ra of the rear cam 305R is positioned at a position on the −Z side (lower side) with respect to the middle of the rear long hole 306Ra of the raising-and-lowering member 306 and on the X side (rear side) of the first rear long hole 302Ra of the second link member 302.

Consequently, when the LPH 14 is in the exposure position, the front pin 306Fa of the raising-and-lowering member 306 stays at a position further from the front shaft 305Fa of the front cam 305F in the Z direction than in the case where the LPH 14 is in the standby position. In addition, when the LPH 14 is in the exposure position, the rear pin 306Ra of the raising-and-lowering member 306 stays at a position further from the rear shaft 305Ra of the rear cam 305R in the Z direction than in the case where the LPH 14 is in the standby position.

In this state, the lever 172 connected to the second link member 302 via the first link member 301 is stationary in the erect state extending in the Z direction.

Referring now to FIGS. 26E, 26C, 27A, and 28A, the operation of the retractable mechanism 17 when switching the LPH 14 from the standby position to the withdrawn position and the state of the retractable mechanism 17 when bringing the LPH 14 to the withdrawn position will be described.

When the LPH 14 is moved from the standby position to the withdrawn position, the lever 172 is operated in the direction of arrow D. Thus, the lever 172 is rotated around the shaft 172a. As the lever 172 is rotated, the shaft 172b attached to the lever 172 is also rotated in the direction of arrow D. Consequently, the first link member 301 attached to the shaft 172b is pushed in the X direction (rearward). When the first link member 301 is pushed rearward, the second link member 302 connected to the first link member 301 via the shaft 301a moves in the X direction against the compressive force of the front coil spring 304F, exerted thereon via the front cam 305F and the front protrusion 305Fb that is in contact with the front end of the second front long hole 302Fb, and the compressive force of the rear coil spring 304R, exerted thereon via the rear cam 305R and the rear protrusion 305Rb that is in contact with the front end of the second rear long hole 302Rb.

At this time, the front cam 305F rotates counterclockwise in the drawings around the front shaft 305Fa while keeping the front protrusion 305Fb in the state of abutting against the second front long hole 302Fb of the second link member 302.

The rear cam 305R also rotates counterclockwise in the drawings around the rear shaft 305Ra while keeping the rear protrusion 305Rb in the state of abutting against the second rear long hole 302Rb of the second link member 302.

Meanwhile, the front cam 305F and the rear cam 305R rotate counterclockwise together at the same angle along with the movement of the second link member 302 in the X direction (rearward).

As a result of the rotation of the front cam 305F and the rear cam 305R, in the raising-and-lowering member 306, the front pin 306Fa is pressed by a Z side inner wall surface of the pin holding opening 3052 of the front cam 305F and the rear pin 306Ra is pressed by a Z side inner wall surface of the pin holding opening 3052 of the rear cam 305R.

Since the front pin 306Fa and the rear pin 306Ra are pressed in the −Z direction in this manner, the raising-and-lowering member 306 to which the front pin 306Fa and the rear pin 306Ra are attached is pushed downward in the −Z direction.

Thus, the raising-and-lowering member 306 falls in the −Z direction from the standby position while keeping the holding portions 173a and the support portions 173b on the front and rear sides horizontal, moves to a third position, at which the raising-and-lowering member 306 is closer to the casing 171 than when it is in the first position, and stops at the third position.

At this time, the front shaft 305Fa of the front cam 305F is positioned at a position on the Z side (upper side) with respect to the middle of the front long hole 306Fa of the raising-and-lowering member 306 and on the −X side (front side) of the first front long hole 302Fa of the second link member 302. On the other hand, the rear shaft 305Ra of the rear cam 305R is positioned at a position on the Z side (upper side) with respect to the middle of the rear long hole 306Ra of the raising-and-lowering member 306 and on the −X side (front side) of the first rear long hole 302Ra of the second link member 302.

Consequently, when the LPH 14 is in the withdrawn position, the front pin 306Fa of the raising-and-lowering member 306 stays at a position further from the front shaft 305Fa of the front cam 305F in the −Z direction than in the case where the LPH 14 is in the standby position. In addition, when the LPH 14 is in the withdrawn position, the rear pin 306Ra of the raising-and-lowering member 306 stays at a position further from the rear shaft 305Ra of the rear cam 305R in the −Z direction than in the case where the LPH 14 is in the standby position.

In this state, the lever 172 connected to the second link member 302 via the first link member 301 is stationary in the lying state extending in the −X direction.

As in the case of a general structure, the LPH 14 included in the exposure module EM according to the exemplary embodiment has a characteristic frequency. When the frequency of vibrations input to the LPH 14 is approximate to the characteristic frequency of the LPH 14, the LPH 14 resonates. When the LPH 14 resonates while the LPH 14 is in the above-described exposure position, an electrostatic latent image formed on the photoconductor drum 12 of the photoconductor module PM or a toner image formed subsequently becomes more likely to have unevenness or streaks.

In view of this, it is preferable that the LPH 14 be prevented from resonating in order to reduce the occurrence of the unevenness or streaks on an electrostatic latent image formed on the photoconductor drum 12 or a toner image.

Vibrations input to the LPH 14 are attributable to, for example, vibrations of the apparatus body of the image forming apparatus 1. Thus, as an example of a way of preventing the LPH 14 from resonating, the frequency of vibrations caused by the apparatus body of the image forming apparatus 1 may be made different from that of the characteristic frequency of the LPH 14.

In the exposure module EM according to the exemplary embodiment, a spring member 70 is disposed so as to clamp the front plate member 51F of the LPH 14 and the support portion 173b of the retractable mechanism 17 together and another spring member 70 is disposed so as to clamp the rear plate member 51R of the LPH 14 and the support portion 173b of the retractable mechanism 17 together. This configuration restricts the movement of the LPH 14 in the Z and Y directions relative to the retractable mechanism 17 and adjusts the characteristic frequency of the LPH 14.

Figure 29:
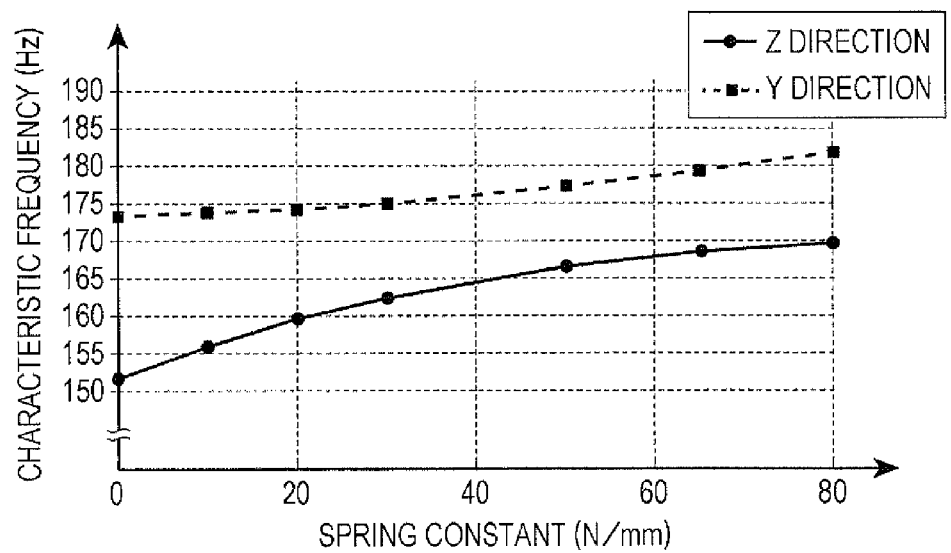
FIG. 29 illustrates the relationship between the spring constant of the spring member attached to the exposure module and the characteristic frequency of the LPH.

FIG. 29 illustrates the relationship between the spring constant of the spring members 70 attached to the exposure module EM and the characteristic frequency of the LPH 14. In FIG. 29, the solid line indicates the relationship between the spring constant of the spring members 70 and the frequency of the LPH 14 in the Z direction, while the broken line indicates the relationship between the spring constant of the spring member 70 and the frequency of the LPH 14 in the Y direction. In FIG. 29, the case where the spring constant is zero is the case where the spring members 70 are not attached to the exposure module EM.

As illustrated in FIG. 29, by attaching the spring members 70 to the exposure module EM, the characteristic frequency of the LPH 14 in the Z direction and the characteristic frequency of the LPH 14 in the Y direction are made adjustable so as to be higher than those in the case where the spring members 70 are not attached to the exposure module EM.

When the characteristic frequency of the LPH 14 is made adjustable so as to be higher in the Z and Y directions, it is easy to set, for example, the frequency of vibrations caused by the apparatus body of the image forming apparatus 1 to be lower than the characteristic frequency of the LPH 14. When the frequency of vibrations caused by the apparatus body of the image forming apparatus 1 is set to be lower than the characteristic frequency of the LPH 14, by adjusting the characteristic frequency of the LPH 14 so as to be higher, the difference between the frequency of vibrations caused by the apparatus body of the image forming apparatus 1 and the characteristic frequency of the LPH 14 is capable of being increased compared to the case where the configuration according to the exemplary embodiment is not employed.

As a consequence, compared to the case where the configuration according to the exemplary embodiment is not employed, the LPH 14 is made less likely to resonate due to vibrations of, for example, the apparatus body of the image forming apparatus 1.

In the exemplary embodiment, as illustrated in FIG. 29, by changing the spring constant of each spring member 70 attached to the exposure module EM, the difference between the characteristic frequency of the LPH 14 in the Z direction and the characteristic frequency of the LPH 14 in the Y direction are made adjustable. In the example illustrated in FIG. 29, when the spring members 70 have a spring constant of 50 N/mm, the difference between the characteristic frequency of the LPH 14 in the Z direction and the characteristic frequency of the LPH 14 in the Y direction is 10 Hz, which is the smallest.

By thus adjusting the difference between the characteristic frequency of the LPH 14 in the Z direction and the characteristic frequency of the LPH 14 in the Y direction, the frequency of vibrations caused by, for example, the apparatus body of the image forming apparatus 1 is more easily changed so as to be apart from both the characteristic frequency of the LPH 14 in the Z direction and the characteristic frequency of the LPH 14 in the Y direction.

As a result, the LPH 14 becomes less likely to resonate due to vibrations input from, for example, the apparatus body of the image forming apparatus 1.

In the exemplary embodiment, as described above, when the LPH 14 is in the exposure position, the position of the front side of the LPH 14 in the Z direction is determined as a result of the support portion 173b disposed on the front side of the raising-and-lowering member 306 raising the first front positioning pin 611F of the LPH 14 and an upper portion of the first front positioning pin 611F abutting against the front BB 122F (see FIG. 6) disposed on the front side of the photoconductor module PM.

Similarly, the position of the rear side of the LPH 14 in the Z direction is determined when the support portion 173b disposed on the rear side of the raising-and-lowering member 306 raises the first rear positioning pin 611R of the LPH 14 and an upper portion of the first rear positioning pin 611R abuts against the rear BB 122R (see FIG. 6) disposed on the rear side of the photoconductor module PM.

In other words, in the exemplary embodiment, the position of the LPH 14 in the Z direction relative to the photoconductor module PM is determined by a force by which the first front positioning pin 611F abuts against the front BB 122F of the photoconductor module PM and a force by which the first rear positioning pin 611R abuts against the rear BB 122R of the photoconductor module PM.

In the exemplary embodiment, each spring member 70 is disposed so as to clamp together the corresponding support portion 173b of the raising-and-lowering member 306 included in the retractable mechanism 17 and the third front extension 513F of the front plate member 51F or the third rear extension 513R of the rear plate member 51R disposed in the LPH 14.

The spring member 70 thus changes the state of contact between the LPH 14 and the retractable mechanism 17, but does not change the force with which the first front positioning pin 611F abuts against the front BE 122F or the force with which the first rear positioning pin 611R abuts against the rear BB 122R.

Thus, the exemplary embodiment enables adjustment of the characteristic frequency of the LPH 14 while the position of the LPH 14 in the Z direction relative to the photoconductor module PM is prevented from being changed.

In addition, as described above, when the LPH 14 is in the exposure position, the force with which the raising-and-lowering member 306 pushes up the LPH 14 relative to the photoconductor module PM corresponds to the sum of the pulling forces of the front coil spring 304F and the rear coil spring 304R.

In the exposure module EM according to the exemplary embodiment, it is preferable that the spring constant of each spring member 70 be larger than the spring constant of the front coil spring 304F or the rear coil spring 304R. This configuration reduces the effect of the pulling forces of the front coil spring 304F and the rear coil spring 304R when each spring member 70 changes its force that will bring the LPH 14 and the retractable mechanism 17 into contact together, whereby the spring member 70 is capable of more efficiently adjusting the characteristic frequency of the LPH 14.

In the case, however, where a spring member 70 is attached to, for example, a middle portion of the exposure module EM in the axial direction (X direction), the LPH 14 may warp due to an elastic force of the spring member 70 exerting on the middle portion of the LPH 14 in the axial direction.

On the other hand, in the exemplary embodiment, the first plate portion 71 of each spring member 70 has the cutout portion 74. When each spring member 70 is attached to the exposure module EM, the first front positioning pin 611F or the first rear positioning pin 611R is inserted into the cutout portion 74 of the spring member 70, so that the spring member 70 is attached to the exposure module EM so as to be adjacent to the first front positioning pin 611F or the first rear positioning pin 611R.

Thus, the exemplary embodiment is capable of making the LPH 14 less likely to warp than in the case where the configuration according to the exemplary embodiment is not employed.

In the above-described example, in addition to the front plate member 51F and the rear plate member 51R, the spring members 70, which have a clip-like shape, are provided so as to be positioned below (on the −Z side of) the first front positioning pin 611F and the first rear positioning pin 611R. However, the form of the spring members 70 is not limited to this configuration.

Figure 30:
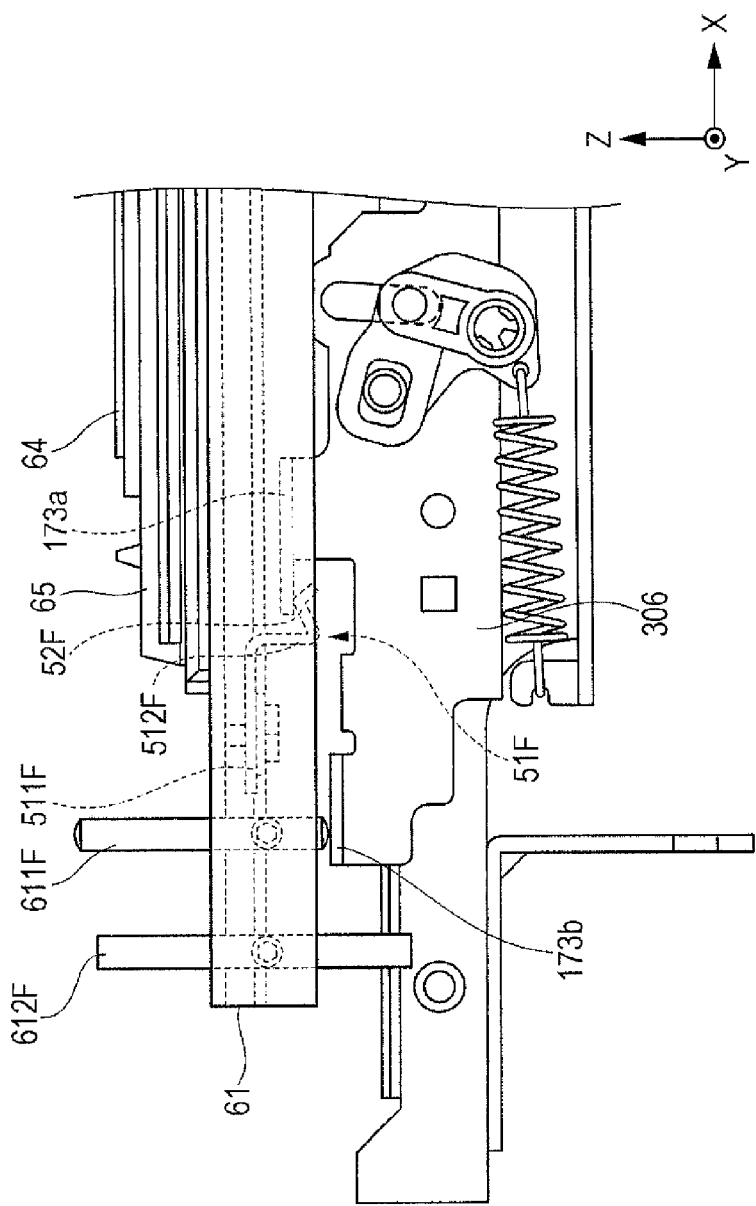
FIG. 30 is a front view of an exposure module according to another exemplary embodiment where a front-side portion of the exposure module is viewed in the −Y direction.

FIGS. 30 and 31 illustrate another exemplary embodiment of the invention. FIG. 30 is a front view of an exposure module EM according to another exemplary embodiment where a front-side portion of the exposure module FM is viewed in the –Y direction and FIG. 31 is a front view of the exposure module EM according to another exemplary embodiment where a rear-side portion of the exposure module EM is viewed in the –Y direction. In FIG. 30 and FIG. 31, the exposure module EM has a similar configuration to that of the exposure module EM illustrated in FIGS. 10 to 22 and other drawings except for the front plate member 51F and the rear plate member 51R included in the LPH 14.

As illustrated in FIG. 30, in this exemplary embodiment, a front plate member 51F includes a first front extension 511F extending in the X direction, a second front extension 512F extending in the –Z direction from a downstream side end of the first front extension 511F in the X direction, and a front leaf spring portion 52F. The front leaf spring portion 52F extends in the X direction from the upstream side end of the second front extension 512F in the Z direction, is bent midway, and has a V-shaped cross section.

In this exemplary embodiment, the front leaf spring portion 52F of the front plate member 51F comes into contact with the holding portion 173*a* of the raising-and-lowering member 306 from below the holding portion 173*a*. The front leaf spring portion 52F of the front plate member 51F pushes the holding portion 173*a* in the Z direction with its elastic force, whereby a force directing in the Z direction is applied to the raising-and-lowering member 306.

Consequently, a contact force between the lower end of the first front positioning pin 611F of the LPH 14 and the support portion 173*b* of the raising-and-lowering member 306 of the retractable mechanism 17 increases. This configuration restricts movement of the LPH 14 relative to the retractable mechanism 17.

In addition, as illustrated in FIG. 31, in this exemplary embodiment, the rear plate member 51R includes a first rear extension 511R extending in the X direction, a second rear extension 512R extending in the –Z direction from the downstream end of the first rear extension 511R in the X direction, and a rear leaf spring portion 52R. The rear leaf spring portion 52R extends in the X direction from an upstream end of the second rear extension 512R in the Z direction, is bent midway, and has a V-shaped cross section.

In this exemplary embodiment, the rear leaf spring portion 52R of the rear plate member 51R comes into contact with the holding portion 173*a* of the raising-and-lowering member 306 from below the holding portion 173*a*. The rear leaf spring portion 52R of the rear plate member 51R pushes the holding portion 173*a* in the Z direction with its elastic force, whereby a force directing in the Z direction is applied to the raising-and-lowering member 306.

Consequently, a contact force between the lower end of the first rear positioning pin 611R of the LPH 14 and the support portion 173*b* of the raising-and-lowering member 306 of the retractable mechanism 17 increases. This configuration restricts movement of the LPH 14 relative to the retractable mechanism 17.

As described above, in the exemplary embodiment illustrated in FIGS. 30 and 31, the movement of the LPH 14 relative to the retractable mechanism 17 is restricted by increasing the contact force between the LPH 14 and the retractable mechanism 17 at the positions adjacent to the first front positioning pin 611F and the first rear positioning pin 611R of the exposure module EM. Thus, the characteristic frequency of the LPH 14 is made adjustable in the exposure module EM.

In the above-described exemplary embodiment, the characteristic frequency of the LPH 14 is adjusted by changing the contact force between the LPH 14 and the retractable mechanism 17 using leaf springs, such as the spring members 70 or the front leaf spring portion 52F of the front plate member 51F and the rear leaf spring portion 52R of the rear plate member 51R. However, components used for adjusting the characteristic frequency of the LPH 14 are not limited to leaf springs.

For example, an elastic member such as an elastic spring may be disposed between the support portion 173*b* of the raising-and-lowering member 306 and the third front extension 513F or the third rear extension 513R of the LPH 14 so that the support portion 173*b* and the third front extension 513F or the third rear extension 513R pull each other. Alternatively, for example, an elastic member such as a compressive spring may be disposed between the support portion 173*b* of the raising-and-lowering member 306 and the third front extension 513F or the third rear extension 513R of the LPH 14 so that a force that separates the support portion 173*b* and the third front extension 513F or the third rear extension 513R from each other is applied.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An exposure device comprising:
   an exposure member that includes a plurality of light-emitting devices arranged along a first direction, which is an axial direction of an image carrier that rotates, the exposure member exposing the image carrier to light by emitting light in a second direction, which is a direction from the plurality of light-emitting devices to the image carrier;
   an abutment member that includes a contact portion that comes into contact with the exposure member, the abutment member causing the exposure member to abut against the image carrier by pressing the exposure member in the second direction using the contact portion; and
   an elastic member that is interposed between the exposure member and the abutment member, the elastic member being elastically deformable in a direction in which the exposure member and the abutment member approach or recede from each other,
   wherein the exposure member includes a first protrusion and a second protrusion, the first protrusion protruding in the second direction toward the abutment member and being in contact with the contact portion of the abutment member, the second protrusion protruding in the second direction toward the image carrier,
   wherein the abutment member causes the second protrusion of the exposure member to abut against the image carrier by pressing the first protrusion of the exposure member using the contact portion, and
   wherein the elastic member is disposed adjacent to the contact portion of the abutment member and the first protrusion of the exposure member.

2. The exposure device according to claim 1, wherein the elastic member is provided in a plurality and the plurality of the elastic members are disposed on two end portions in the first direction along which the plurality of light-emitting devices are arranged.

3. The exposure device according to claim 2, wherein the contact portion is provided in a plurality, wherein the exposure member includes two first protrusions and two second protrusions, the first protrusions protruding in the second direction toward the abutment member and being in contact with the respective contact portions of the abutment member, the second protrusions protruding in the second direction toward the image carrier, wherein the abutment member causes the second protrusions of the exposure member to abut against the image carrier by pressing the first protrusions of the exposure member using the respective contact portions, and wherein each of the elastic members is disposed adjacent to a corresponding one of the contact portions of the abutment member and a corresponding one of the first protrusions of the exposure member.

* * * * *